(12) United States Patent
Murin et al.

(10) Patent No.: US 7,613,045 B2
(45) Date of Patent: Nov. 3, 2009

(54) OPERATION SEQUENCE AND COMMANDS FOR MEASURING THRESHOLD VOLTAGE DISTRIBUTION IN MEMORY

(75) Inventors: Mark Murin, Kfar Saba (IL); Mark Shlick, Ganei Tikva (IL); Menahem Lasser, Kohav-Yair (IL); Cuong Trinh, Fremont, CA (US)

(73) Assignees: SanDisk IL, Ltd., Kfar Saba (IL); SanDisk Corporation, Milpitas, CA (US)

( * ) Notice: Subject to any disclaimer, the term of this patent is extended or adjusted under 35 U.S.C. 154(b) by 97 days.

(21) Appl. No.: 11/945,120

(22) Filed: Nov. 26, 2007

(65) Prior Publication Data

US 2009/0135646 A1    May 28, 2009

(51) Int. Cl.
*G11C 16/06* (2006.01)
(52) U.S. Cl. .............................. 365/185.2; 365/185.03; 365/185.05; 365/189.01
(58) Field of Classification Search .............. 365/185.2, 365/185.03, 185.05, 189.01
See application file for complete search history.

(56) References Cited

U.S. PATENT DOCUMENTS

| | | | |
|---|---|---|---|
| 5,386,422 A | 1/1995 | Endoh et al. | |
| 5,570,315 A | 10/1996 | Tanaka et al. | |
| 5,761,125 A | 6/1998 | Himeno | |
| 5,774,397 A | 6/1998 | Endoh et al. | |
| 6,031,763 A | 2/2000 | Sansbury | |
| 6,046,935 A | 4/2000 | Takeuchi et al. | |
| 6,222,762 B1 | 4/2001 | Guterman et al. | |
| 6,226,200 B1 | 5/2001 | Eguchi et al. | |
| 6,456,528 B1 | 9/2002 | Chen | |
| 6,522,580 B2 | 2/2003 | Chen et al. | |
| 6,763,424 B2 | 7/2004 | Conley | |
| 6,859,397 B2 | 2/2005 | Lutze et al. | |
| 7,023,736 B2 | 4/2006 | Cernea et al. | |
| 7,046,568 B2 | 5/2006 | Cernea | |

(Continued)

OTHER PUBLICATIONS

Cha et al., "Application of a negative sweep voltage to control gate of fresh flash memory devices to facilitate threshold voltage test measurement," Proc. of the 1998 IEEE 6th Int. Conf. on Conduction and Breakdown in Solid Dielectrics, 1998, pp. 253-256.

(Continued)

*Primary Examiner*—Connie C Yoha
(74) *Attorney, Agent, or Firm*—Vierra Magen Marcus & DeNiro LLP

(57) ABSTRACT

A memory device generates one or more read reference voltages rather than being explicitly supplied with each read reference voltage from an external host controller. The technique involves providing a command to the memory device that causes a reading of a set of storage elements by the memory device using a reference voltage which is different than a reference voltage used in a previous reading, where the new read reference value is not explicitly set outside the memory device. In one implementation, the memory device is provided with an initial reference voltage and a step size for generating additional reference voltages. The technique can be used, e.g., in determining a threshold voltage distribution of a set of storage elements. In this case, a voltage sweep can be applied to a word line associated with the set of storage elements, and data obtained based on the number of conductive storage elements.

38 Claims, 17 Drawing Sheets

U.S. PATENT DOCUMENTS

| | | | |
|---|---|---|---|
| 7,162,376 B2 * | 1/2007 | Oh et al. | 702/57 |
| 7,187,585 B2 | 3/2007 | Li et al. | |
| 7,196,931 B2 | 3/2007 | Cernea et al. | |
| 7,254,668 B1 | 8/2007 | Chang et al. | |
| 7,502,254 B2 * | 3/2009 | Murin et al. | 365/185.03 |
| 2004/0255090 A1 | 12/2004 | Guterman et al. | |
| 2005/0024939 A1 | 2/2005 | Chen et al. | |
| 2005/0105333 A1 | 5/2005 | Park et al. | |
| 2006/0039212 A1 | 2/2006 | Chiang et al. | |
| 2006/0126383 A1 | 6/2006 | Shappir et al. | |
| 2006/0140007 A1 | 6/2006 | Cernea et al. | |
| 2006/0158947 A1 | 7/2006 | Chan et al. | |
| 2006/0221692 A1 | 10/2006 | Chen | |
| 2007/0089034 A1 | 4/2007 | Litsyn et al. | |
| 2007/0147113 A1 | 6/2007 | Mokhlesi et al. | |
| 2008/0259684 A1 * | 10/2008 | Shlick et al. | 365/185.03 |

OTHER PUBLICATIONS

Himeno et al., "A new technique for measuring threshold voltage distribution in flash EEPROM devices," Proc. of the 1995 Int. Conf. on Microelectronic Test Structures, 1995, pp. 283-287.

Portal et al., "EEPROM Memory: Threshold Voltage Built In Self Diagnosis," ITC International Test Conference, 2003 IEEE, Paper 2.1, pp. 23-28.

European Search Report dated Jun. 8, 2009, European Patent Application No. 08251689.9.

Toshiba, Tentative Toshiba MOS Digital Integrated Circuit Silicon Gate CMOS, TH58NVG1S3AFT05, 2003.

Ko, et al., "March Test and On-Chip Test Circuit of Flash Memories," Proc. 43rd IEEE Midwest Symp. on Circuits and Systems, 2000.

* cited by examiner

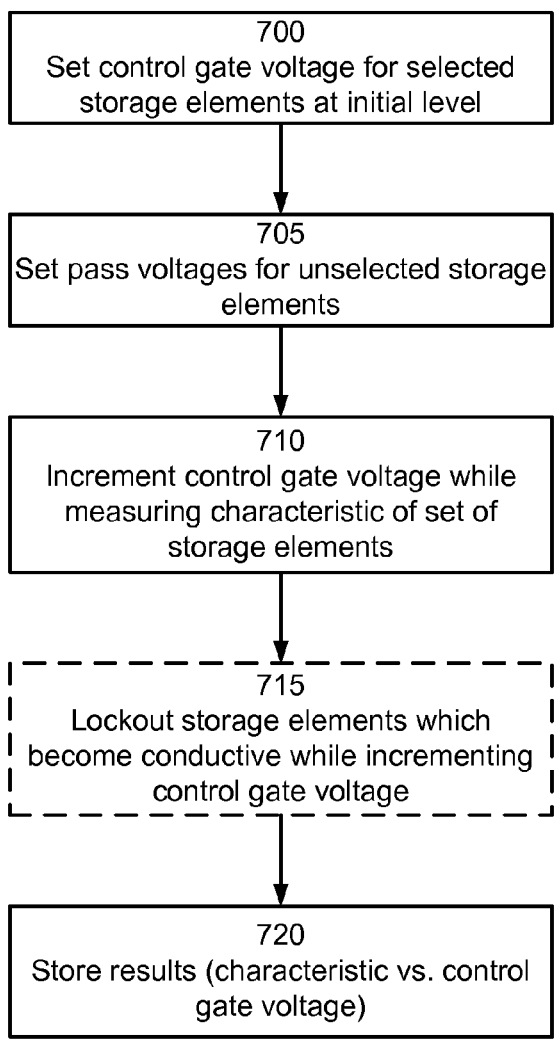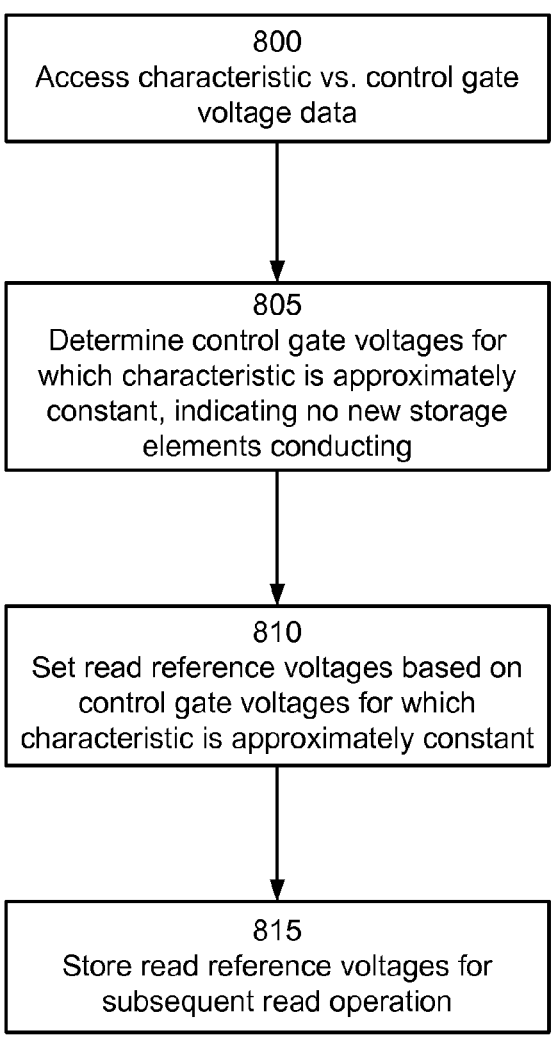

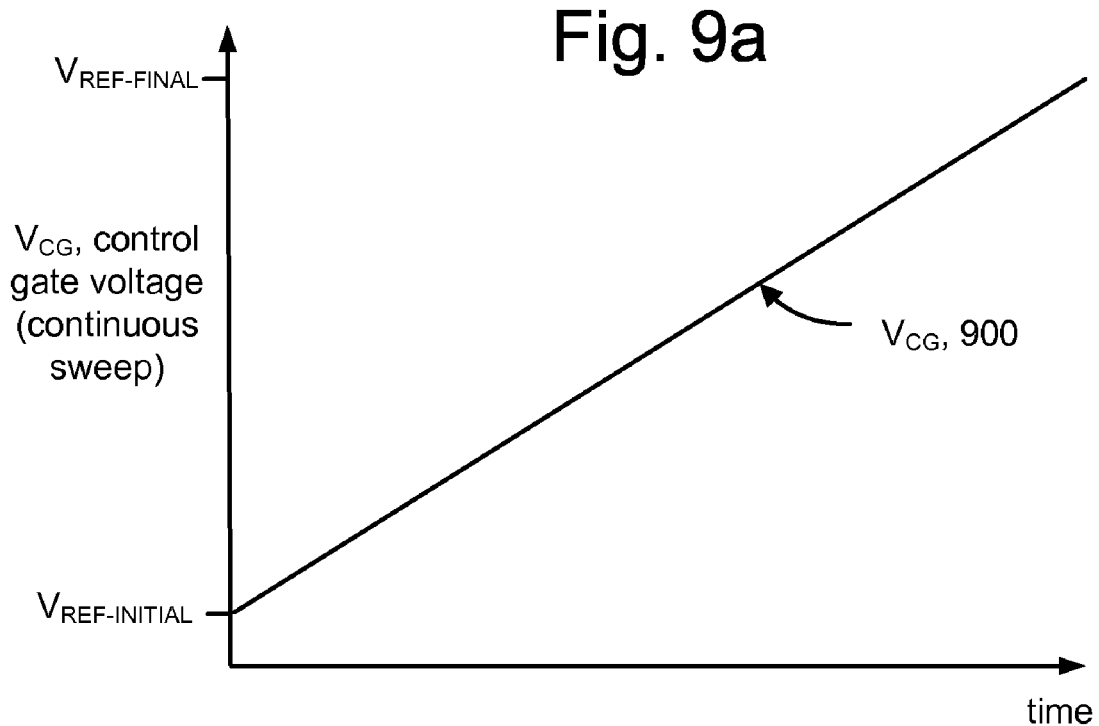
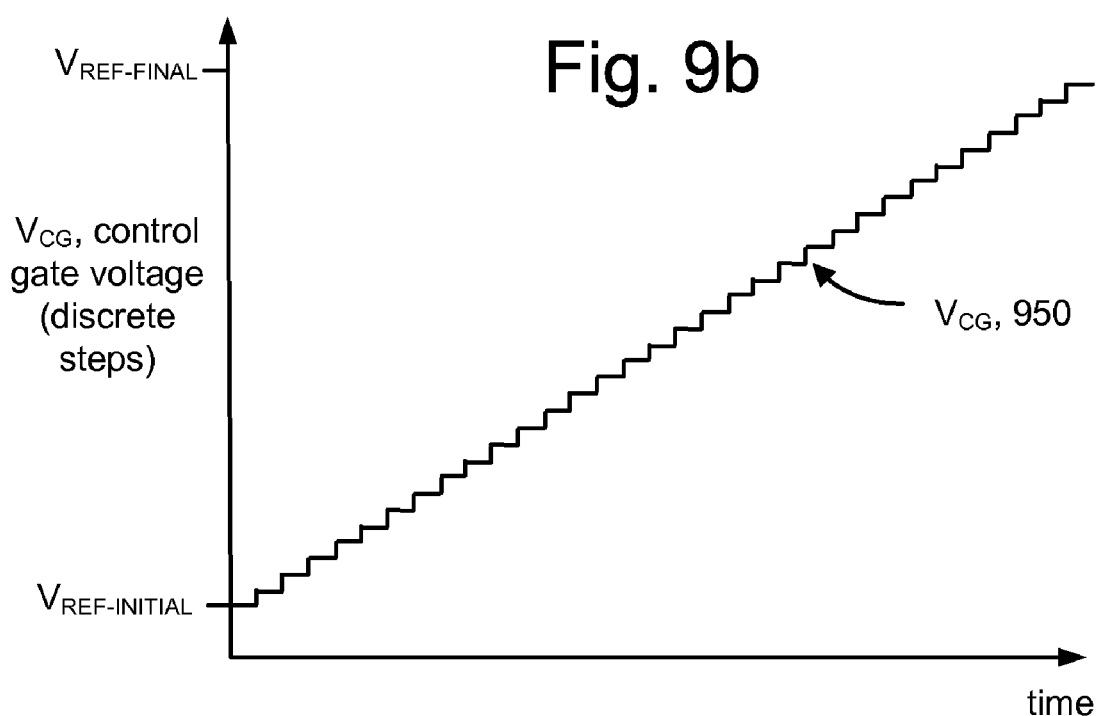

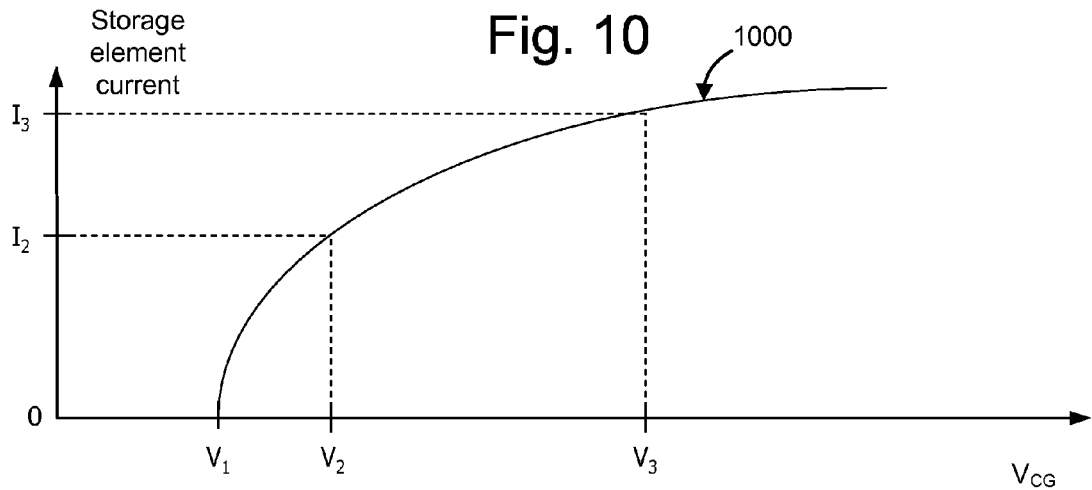
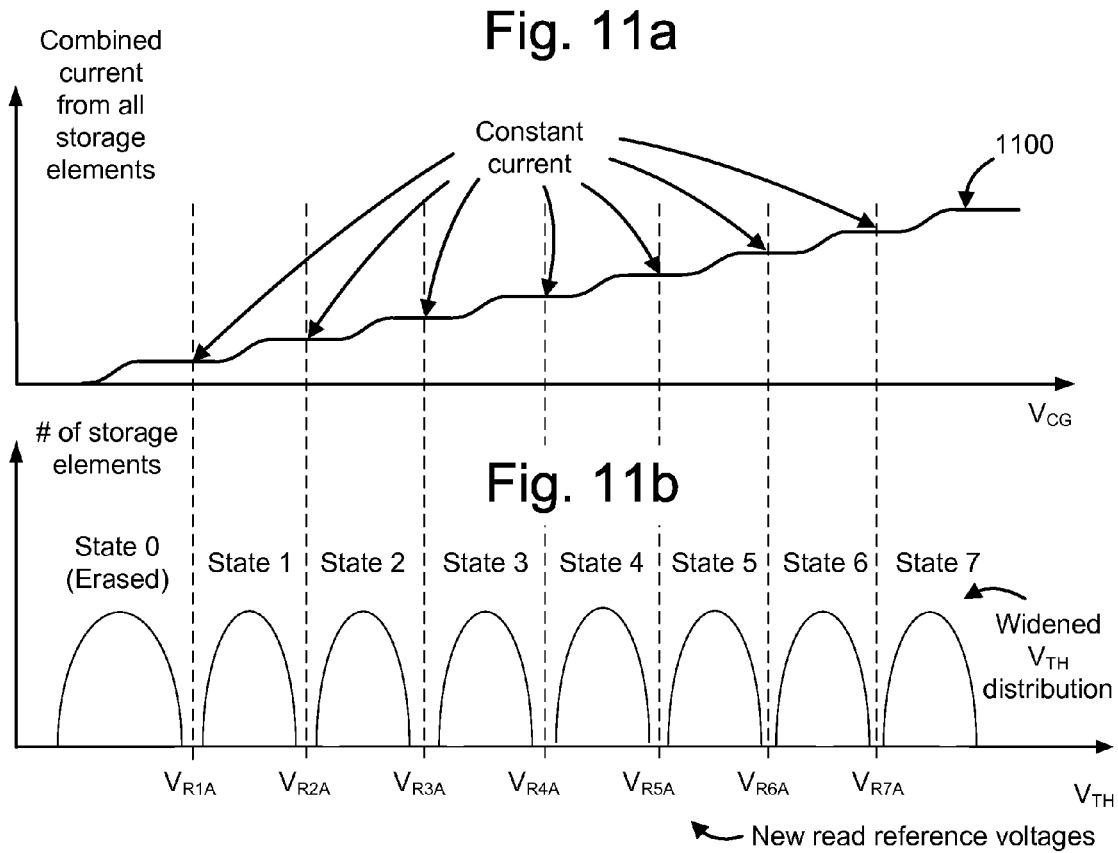

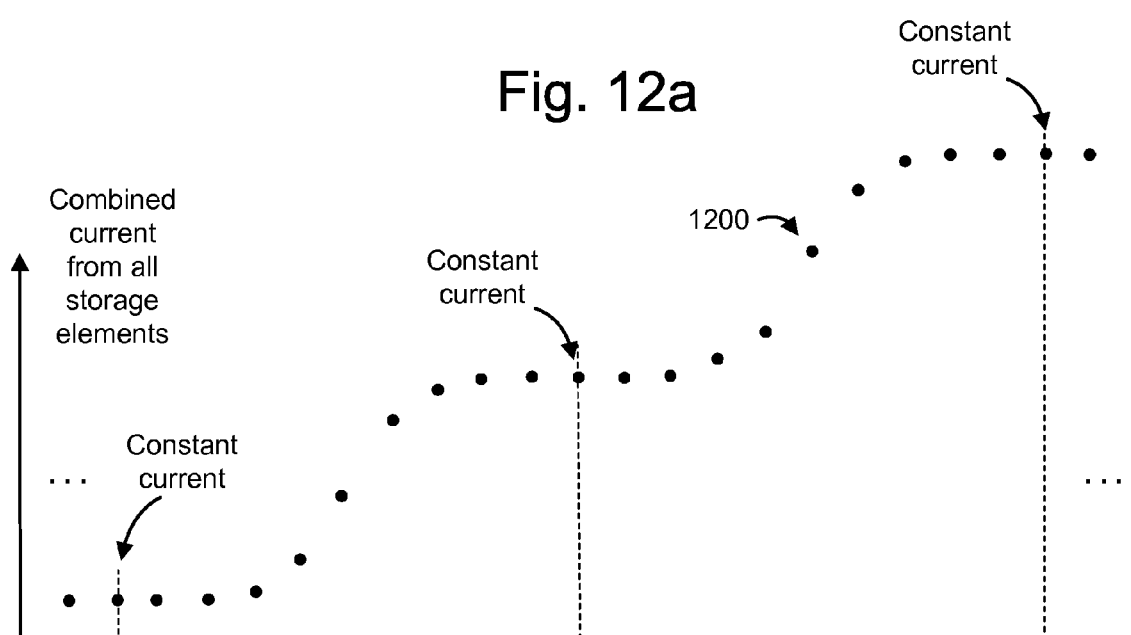
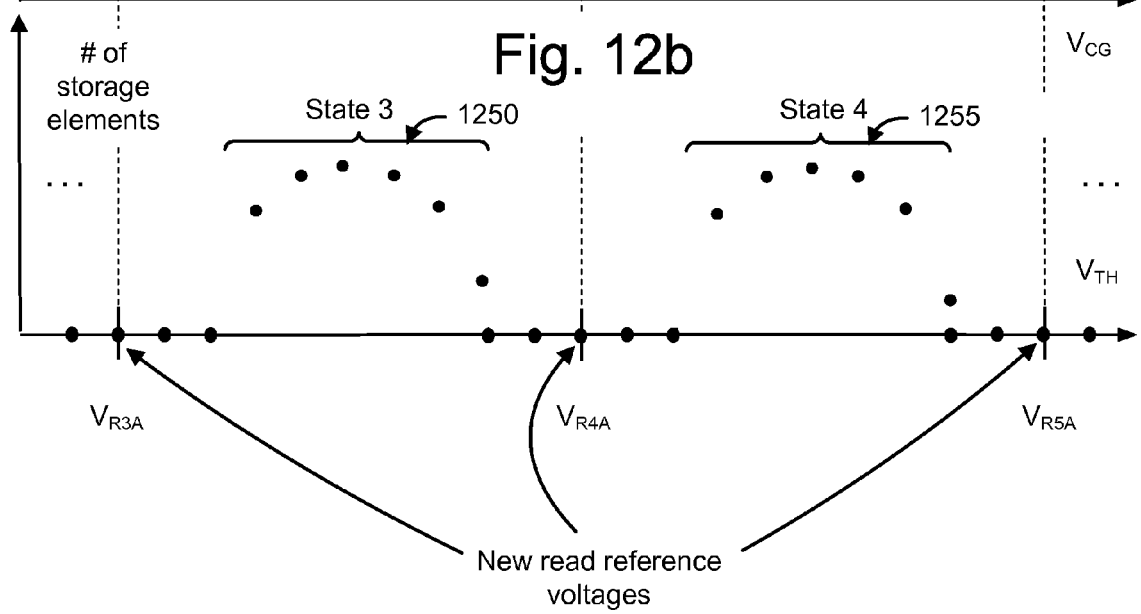

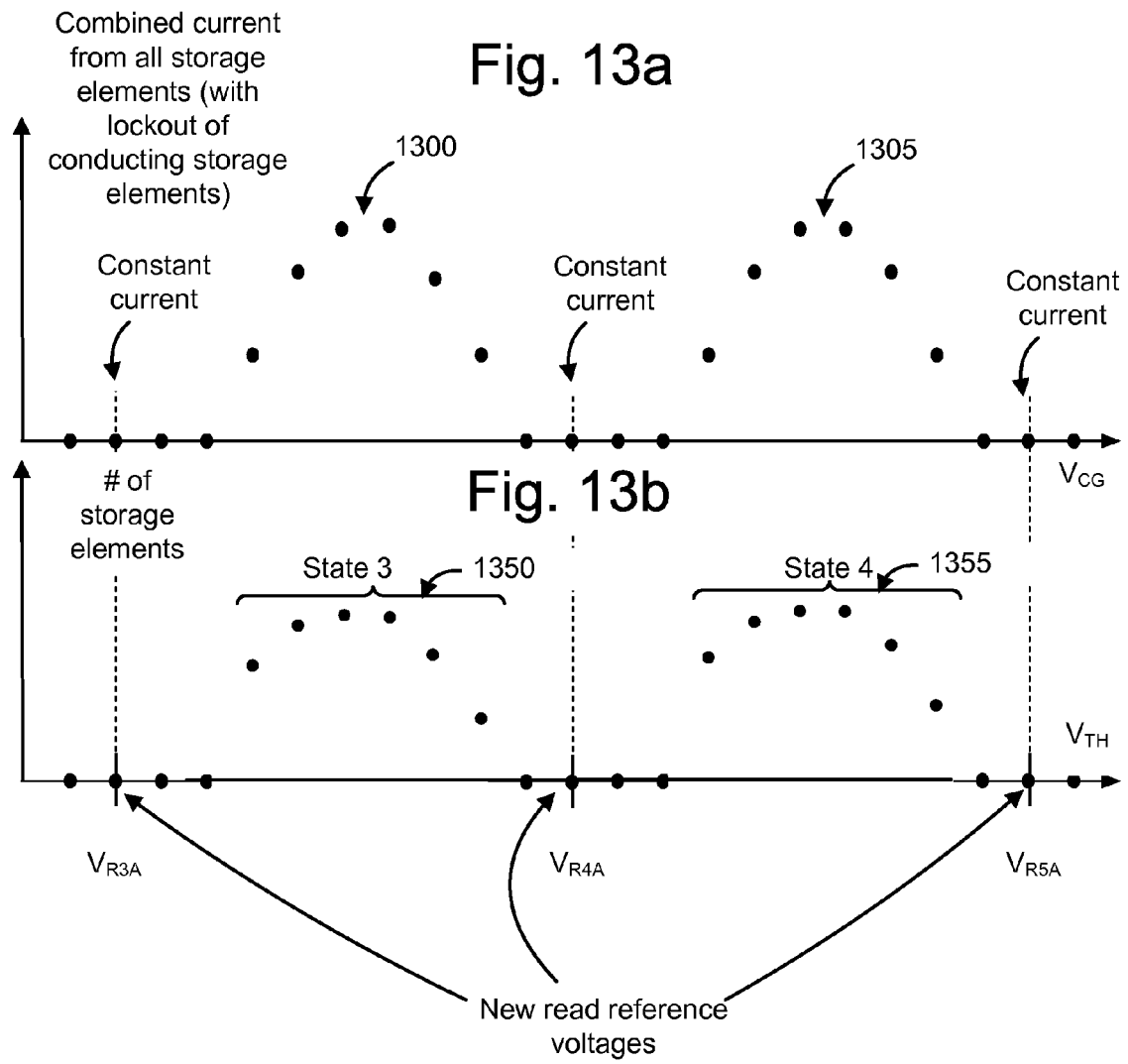

US 7,613,045 B2

OPERATION SEQUENCE AND COMMANDS FOR MEASURING THRESHOLD VOLTAGE DISTRIBUTION IN MEMORY

This application is related to, co-pending, commonly assigned U.S. patent application Ser. No. 11/945,167, (published as US2008/0285351 on Nov. 20, 2008), titled "Measuring Threshold Voltage Distribution In Memory Using An Aggregate Characteristic", incorporated herein by reference.

BACKGROUND OF THE INVENTION

1. Field of the Invention

The present invention relates to a memory device.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

Further, during a read operation, read reference voltages are applied to a set of storage elements to be read, and a determination is made as to which read reference voltage causes a storage element to become conductive. The read reference voltages are set to allow data states of the storage elements to be distinguished. However, the read reference voltages are typically fixed and do not account for the fact that the threshold voltage distribution of a set of storage elements can change, e.g., due to factors such as charge leakage, temperature changes, number of programming cycles and the like. As a result, read errors can occur.

To address this, a threshold voltage distribution of the storage elements can be determined, and new read reference voltages can be set accordingly. However, traditional approaches for computing threshold voltage distribution, e.g., using external analog equipment or the like, lack flexibility and efficiency for being implemented "on-line" in real time flash management procedures or manufacturing testing, for instance, where the time element is critical.

SUMMARY OF THE INVENTION

The present invention provides an operating sequence and commands for measuring threshold voltage distribution in a memory device.

In one embodiment, a method for operating a memory device includes: a) receiving, at the memory device, a first command, b) in response to the first command, reading a set of storage elements in the memory device using a first read reference value but no other read reference value, c) subsequent to the reading, receiving, at the memory device, a second command, and d) in response to the second command, reading the set of storage elements using a second read reference value but no other read reference value. The memory device generates the second read reference value without receiving information for generating the second read reference value from outside the memory device subsequent to the receiving of the first command. For example, the first command can identify a voltage step size, in which case the memory device generates the second read reference value based on the voltage step size and the first read reference value. Or, the memory device can be pre-configured with the voltage step size.

In another embodiment, a method for operating a memory device includes: a) receiving, at the memory device, a first command, b) in response to the first command, reading a set of storage elements in the memory device using a first read reference value, and c) subsequent to said reading, receiving, at the memory device, a second command. The method further includes, in response to the second command, reading the set of storage elements using a second read reference value, where the memory device generates the second read reference value without receiving information for generating the second read reference value from outside the memory device subsequent to the receiving of the first command. The method further includes determining, based at least in part on the readings using the first and second read reference values, a threshold voltage distribution of the set of storage elements.

In another embodiment, a method for operating a memory device includes: a) providing, from a host controller to a memory device, at least a first command, where the memory device reads the set of storage elements using a first read reference value in response to the at least a first command, b) subsequent to the providing the at least a first command, providing from the host controller to the memory device at least a second command. The memory device reads the set of storage elements using a second read reference value in response to the at least a second command, and the memory device generates the second read reference value without receiving information for generating the second read reference value from the host controller subsequent to the receiving of the at least a first command. The method further includes determining, based at least in part on the readings using the first and second read reference values, a threshold voltage distribution of the set of storage elements.

In another embodiment, a storage system includes a set of storage elements in a memory device and at least one control circuit in the memory device. The at least one control circuit: a) receives a first command, b) in response to the first command, reads the set of storage elements using a first read reference value but no other read reference value, c) subsequent to the reading, receives a second command, and d) in response to the second command, reads the set of storage elements using a second read reference value but no other read reference value. Further, the at least one control circuit generates the second read reference value without receiving information for generating the second read reference value from outside the memory device subsequent to the receiving of the first command.

In another embodiment, a storage system includes a set of storage elements in a memory device and at least one control circuit in the memory device. The at least one control circuit: a) receives a first command, b) in response to the first command, reads the set of storage elements using a first read reference value, c) subsequent to the reading, receives a second command, and d) in response to the second command, reads the set of storage elements using a second read reference value. The at least one control circuit generates the second read reference value without receiving information for generating the second read reference value from outside the memory device subsequent to the receiving of the first command, and determines, based at least in part on the readings using the first and second read reference values, a threshold voltage distribution of the set of storage elements.

In another embodiment, a storage system includes a host controller which provides to a memory device, at least a first command, and the memory device reads an associated set of storage elements using a first read reference value in response to the at least a first command. Subsequent to the providing the at least a first command, the host controller provides to the memory device at least a second command, where the memory device reads the set of storage elements using a second read reference value in response to the at least a second command. The memory device generates the second read reference value without receiving information for generating the second read reference value from the host controller subsequent to the receiving of the at least a first command. Moreover, a threshold voltage distribution of the set of storage elements is determined based at least in part on the readings using the first and second read reference values.

BRIEF DESCRIPTION OF THE DRAWINGS

FIG. 7 depicts a process for measuring a characteristic of a set of storage elements.

FIG. 8 depicts a process for using the characteristic obtained by the process of FIG. 7 in setting read reference voltages.

FIG. 9a depicts a control gate voltage which increases continuously.

FIG. 9b depicts a control gate voltage which increases in discrete steps.

FIG. 10 depicts a change in current in a storage element as a function of control gate voltage.

FIG. 11a depicts a combined current in a set of storage elements as a function of a continuously increasing control gate voltage.

FIG. 11b depicts a threshold voltage distribution which is based on FIG. 11a.

FIG. 12a depicts a combined current in a set of storage elements as a function of a step wise increasing control gate voltage.

FIG. 12b depicts a threshold voltage distribution which is based on FIG. 12a.

FIG. 13a depicts a combined current in a set of storage elements as a function of a step wise increasing control gate voltage, with lockout of conducting storage elements.

FIG. 13b depicts a threshold voltage distribution which is based on FIG. 13a.

DETAILED DESCRIPTION

The present invention provides an operating sequence and commands for measuring threshold voltage distribution in a memory device.

Figure 1:
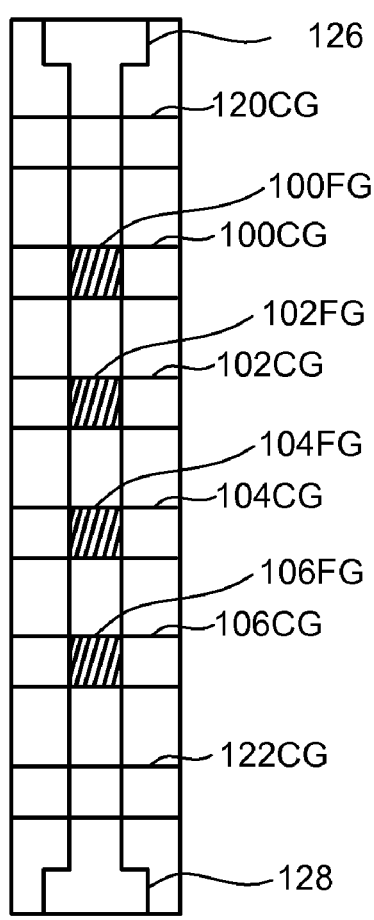
FIG. 1 is a top view of a NAND string.
Figure 2:
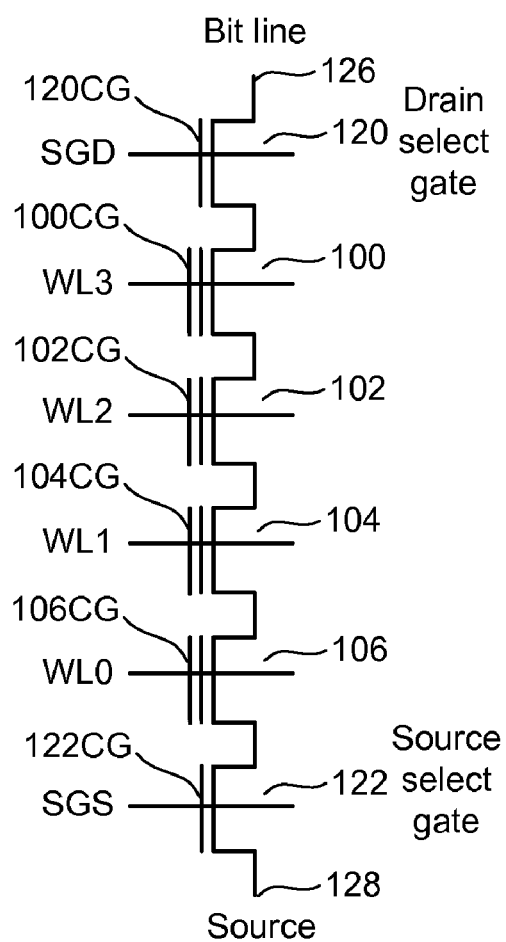
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
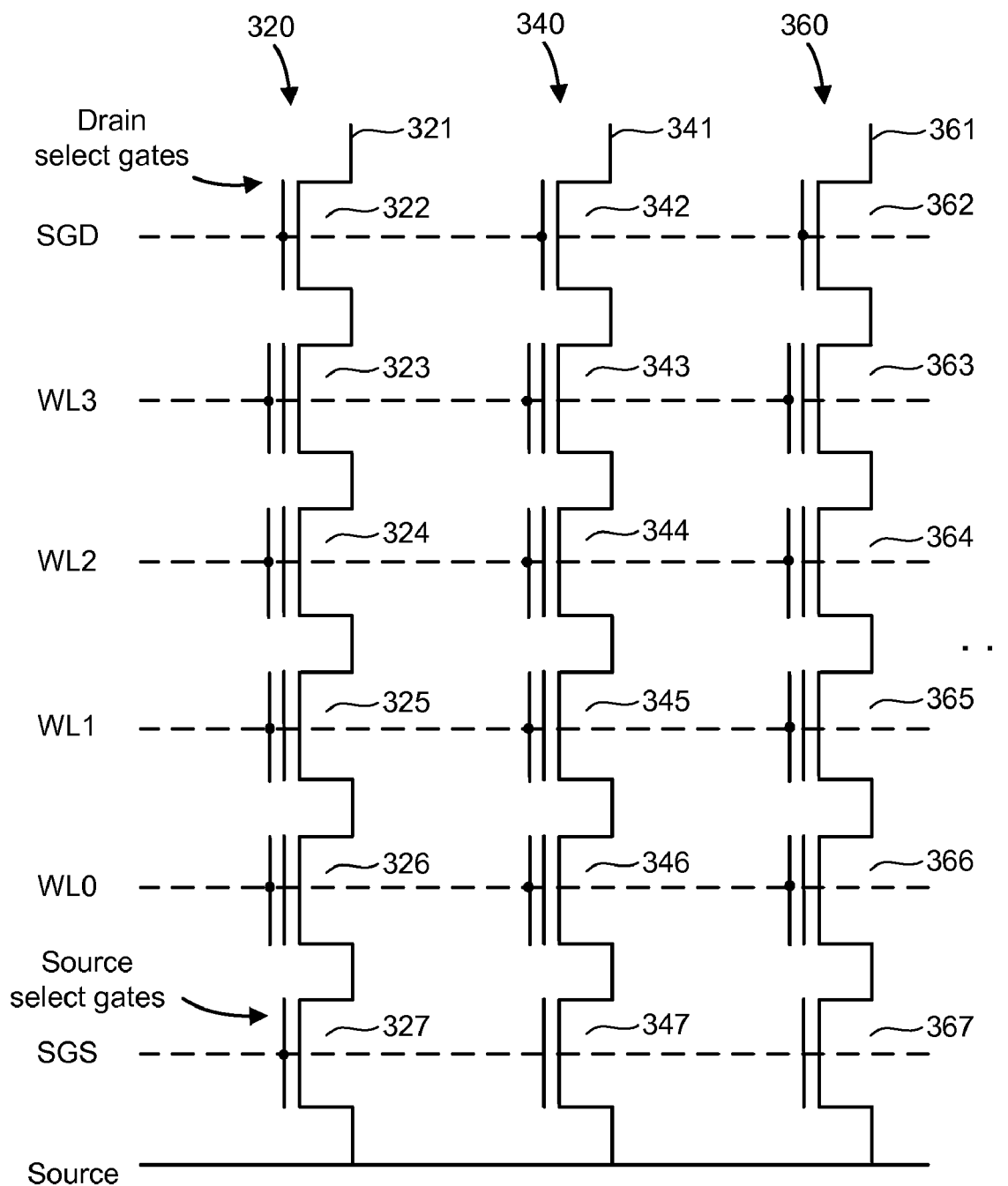
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
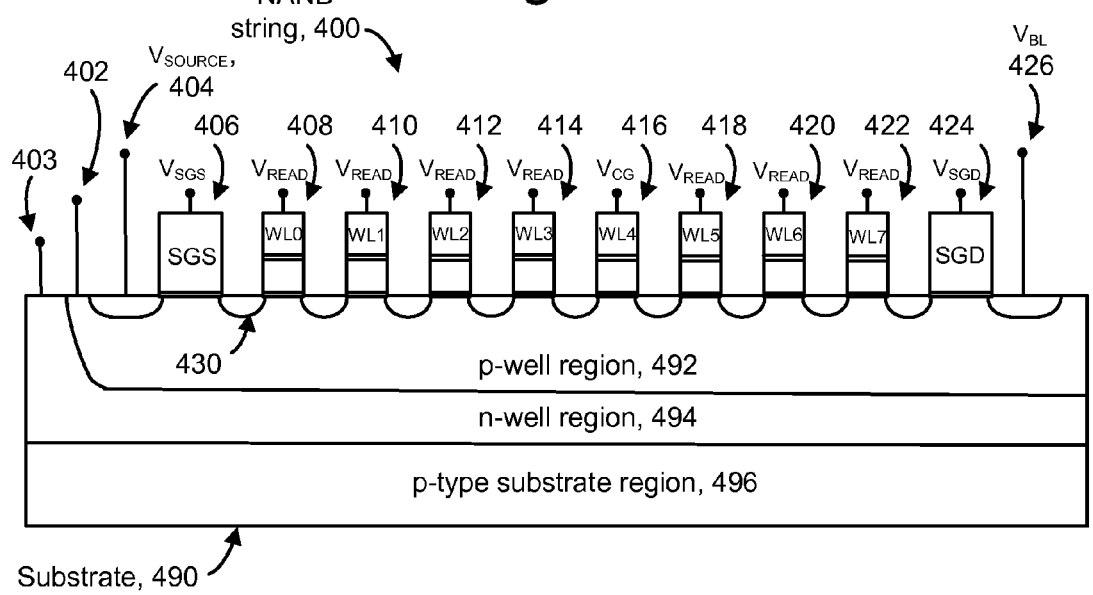
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages can also be applied to the p-well region 492 via a terminal 402 and to the n-well region 494 via a terminal 403.

During a read operation, a control gate voltage $V_{CG}$ is provided on a selected word line, in this example, WL3, which is associated with storage element 414 and other storage elements which are not shown. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$ is applied to the remaining word lines associated with NAND string 400, in one possible scheme. $V_{SGS}$ and $V_{SGD}$ are applied to the select gates 406 and 424, respectively.

Figure 5:
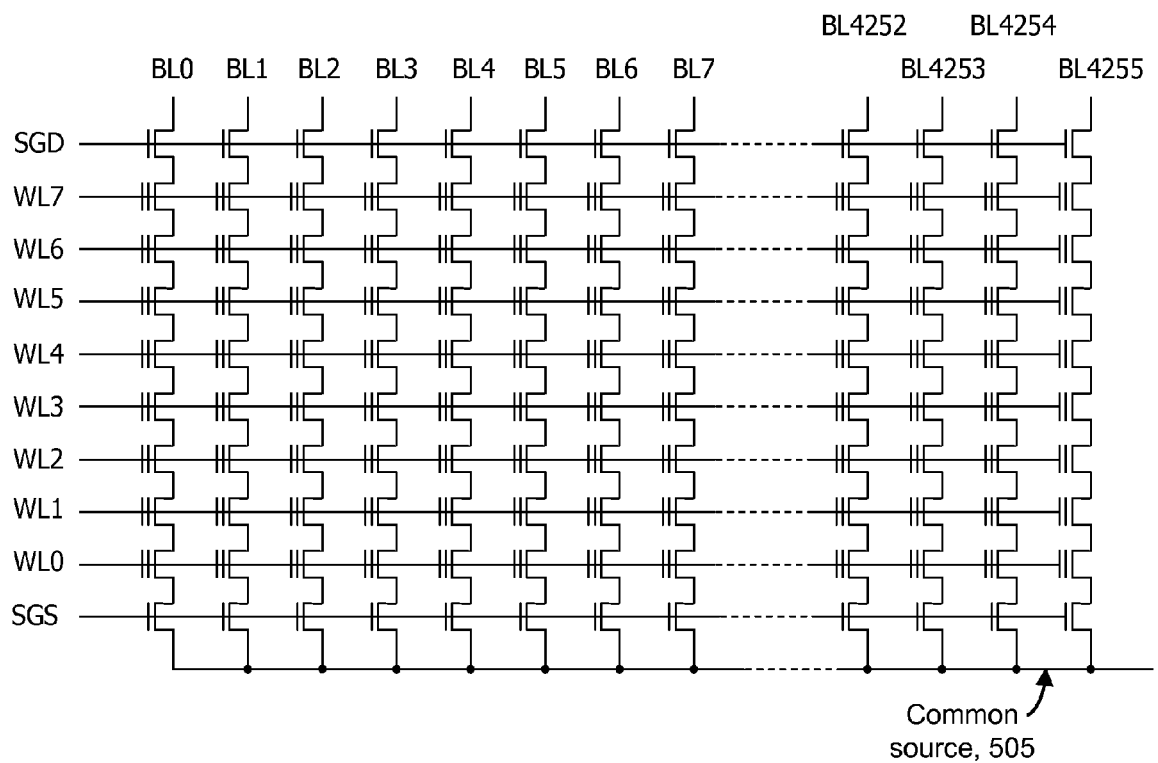
FIG. 5 depicts a block of storage elements.

FIG. 5 depicts a block of storage elements. In one example implementation, a NAND flash EEPROM can be partitioned into 1,024 blocks. The data stored in each block can be simultaneously erased. In one embodiment, the block is the minimum unit of storage elements that are simultaneously erased. In each block, in this example, there are 4,256 columns corresponding to bit lines BL0, BL1, . . . BL4255. In one embodiment referred to as an all bit line (ABL) architecture, all the bit lines of a block can be simultaneously selected during read and program operations, and storage elements along a common word line and connected to any bit line can be programmed at the same time.

In the example provided, eight storage elements are connected in series to form a NAND string, and there are eight data word lines WL0 through WL7. A NAND string can also include dummy storage elements and associated word lines. In other embodiments, the NAND strings can have more or less than eight data storage elements. Data memory cells can store user or system data. Dummy memory cells are typically not used to store user or system data.

One terminal of each NAND string is connected to a corresponding bit line via a drain select gate (connected to select gate drain line SGD), and another terminal is connected to a common source 505 via a source select gate (connected to select gate source line SGS). Thus, the common source 505 is coupled to each NAND string.

In one embodiment, referred to as an odd-even architecture, the bit lines are divided into even bit lines (BLe) and odd bit lines (BLo). In this case, storage elements along a common word line and connected to the odd bit lines are programmed at one time, while storage elements along a common word line and connected to even bit lines are programmed at another time. Data can be programmed into different blocks and read from different blocks concurrently. In each block, the columns are divided into even columns and odd columns.

During one configuration of read and programming operations, 4,256 storage elements are simultaneously selected. The storage elements selected have the same word line and are thus part of a common physical page. Therefore, 532 bytes of data, which also form a logical page, can be read or programmed simultaneously, and one block of the memory can store at least eight logical pages. In this example, a physical page and a logical page are the same but, in general, this is not required. For example, a physical page can include multiple logical pages. A logical page is typically the smallest set of storage elements that are written (programmed) simultaneously. For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines are raised to a read pass voltage, $V_{READ}$, (typically a voltage in the range of 4.5 to 6 V) to make the transistors operate as pass gates. The selected word line is connected to a voltage, a level of which is specified for each read and verify operation, to determine whether a $V_{TH}$ of the concerned storage element is above or below such level. For example, in a read operation for a two-level storage element, the selected word line may be grounded, so that it is detected whether the $V_{TH}$ is higher than 0 V. In a verify operation for a two level storage element, the selected word line is connected to 0.8 V, for example, so that it is verified whether or not the $V_{TH}$ has reached at least 0.8 V. The source and p-well are at 0 V. The selected bit lines are pre-charged to a level of, for example, 0.7 V. If the $V_{TH}$ is higher than the read or verify level on the word line, the potential level of the bit line associated with the storage element of interest maintains the high level because of the non-conductive storage element. On the other hand, if the $V_{TH}$ is lower than the read or verify level, the potential level of the concerned bit line decreases to a low level, for example, less than 0.5 V, because the conductive storage element discharges the bit line. The state of the storage element can thereby be detected by a voltage comparator sense amplifier that is connected to the bit line, in one possible implementation. As with programming, read operations can be performed on a per-page basis.

Many details of erase, read and verify operations described above are performed according to techniques known in the art. Thus, many of the details explained can be varied by one skilled in the art. Other erase, read and verify techniques known in the art can also be used.

Figure 6A:
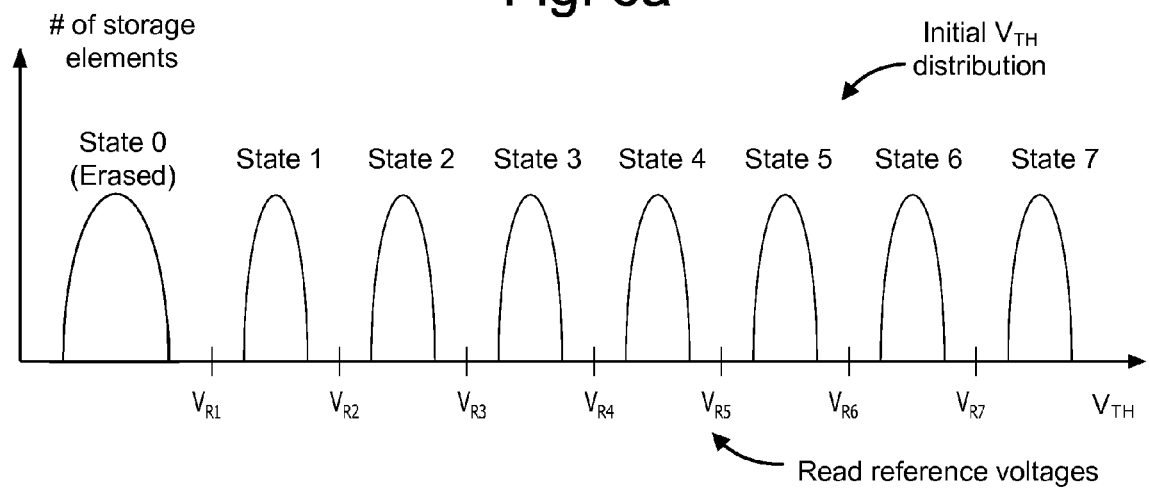
FIG. 6a depicts an initial threshold voltage distribution of a set of storage elements.

FIG. 6a depicts an initial threshold voltage distribution of a set of storage elements. The threshold voltage of a storage element is the lowest voltage that, when applied to the control gate of the storage element, changes the channel state from a non-conducting state to a conducting state. This voltage is affected by the amount of negative charge trapped in the floating gate: the more charge, the higher the threshold voltage of the cell. SLC (Single Level Cell)-type devices use storage elements with zero charged floating gates to represent a "1" state and storage elements with negatively charged floating gates to represent a "0" state. The state can be represented by the storage element's threshold voltage, in this case using two voltage levels, "1" state voltage and "0" state voltage. Although storage elements may have slightly different "0" state voltages, applying a voltage that is between the "1" state voltage and the "0" state voltage to the control gate causes the "1" state storage elements to conduct, but the "0" state storage elements stay in the non-conducting state.

The most common kind of Multi Level Cell (MLC)-type devices uses four charge amounts in the floating gate, including zero charge, so the state can be represented by four voltage levels, thus a MLC storage element stores two bits of data. Generally, N bits per storage element can be represented using $2^N$ voltage levels. Newer devices are expected to use eight or more voltage levels. Using a high number of bits per storage element allows the production of flash devices with high data density and thus reduces the overall cost per flash device.

Further, the read operation of a SLC device uses one reference voltage level that is between the "0" and "1" voltage levels. The read operation in a MLC device with four states uses three reference voltage levels, an MLC device with eight states uses seven reference voltage levels, and, generally, a device that stores N bits per cell, that are represented by $2^N$ states, uses $2^N-1$ reference voltage levels for read operations.

In FIG. 6a, graph includes an x-axis which represents a threshold voltage and a y-axis which represents a number of storage elements. In an example MLC device, the eight states are state 0 through state 7, and the seven reference voltage levels are $V_{R1}$ through $V_{R7}$. In practice, the storage elements which are programmed to a common state will have a range of threshold voltages. Phenomena related to the programming operation, such as cross coupling and program disturb, cause the actual threshold voltage distributions of a population of storage elements to take the form of $2^N$ voltage groups for an N-bits-per-cell device. In an initial threshold voltage distribution, the distribution for each state is relatively narrow as each storage element is programmed to a desired voltage group. Further, ideally, the corresponding reference voltages for reading the storage elements are between the voltage groups, e.g., $V_{R1}$ is between state 0 and state 1, $V_{R2}$ is between state 1 and state 2, and so forth.

The amount of the charge trapped in the floating gate of the storage element should stay unchanged to keep the user data programmed in the memory device. However, the trapped charge can leak, causing the threshold voltage to decrease. Moreover, other factors such as temperature changes, number of programming cycles and so forth, can also affect the threshold voltage, so that the threshold voltage distribution widens and/or shifts over time.

Figure 6B:
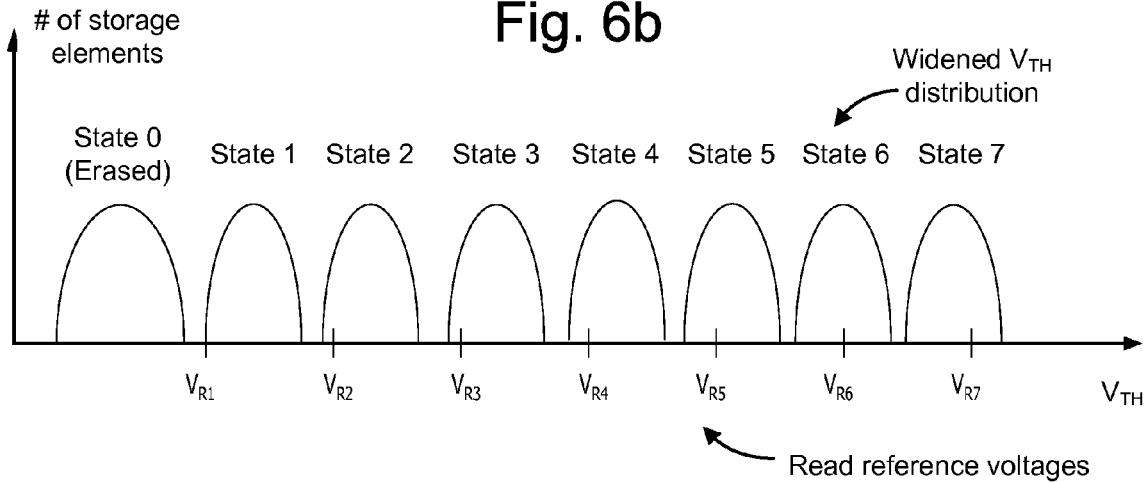
FIG. 6b depicts a widened threshold voltage distribution of a set of storage elements.

FIG. 6b depicts a widened threshold voltage distribution of a set of storage elements. Here, the width of the threshold voltage distribution for each state is wider than that shown in FIG. 6a, and each distribution has shifted downward as well, in this example. In other cases, the distribution can widen but not shift, or shift but not widen. If fixed reference voltage levels such as $V_{R1}$ through $V_{R7}$ are used, this will cause read errors. For example, when $V_{R2}$ is applied to the selected word line, some of the storage elements in state 2 will become conductive, as opposed to the situation where none of the storage elements in state 2 became conductive when $V_{R2}$ was applied to the device with the distribution shown in FIG. 6a.

To address this, a dynamic read technique can be used that changes the read reference voltages, so that the reference voltages are set between the distribution groups. One approach is to change the initial set of reference voltages, e.g. $V_{R1}$ through $V_{R7}$, to another set of reference voltages, where both sets of reference voltages are determined according to the flash device characteristics. Switching from one set to another can be made according to the flash device operation information, such as number of program-erase cycles, temperature changes, time that the user data is kept in the flash, number of bit errors during read operation, and so forth.

Another way to determine the reference voltages is to measure the actual threshold voltage distribution and then to set the read reference voltage levels in such way as to minimize the number of read errors, e.g. by finding the minima points between the distribution groups, or by correlating the actual distribution to some distribution model, etc. This approach is based on an assumption that the memory device contains data represented by all voltage levels, and the data is evenly distributed between the levels, a condition that can be easily achieved by applying a scrambling algorithm to the user data. Unfortunately, the usual process of measuring the actual threshold levels distribution involves reading the memory device with many threshold levels in separate read operations, where the number of levels is dictated by the required resolution of the distribution measurement. If, for example, the memory device uses eight states, representing three bits per storage element, and a resolution of ten points per state is required, then it is necessary to perform read operations for each of 79 threshold levels to measure the threshold voltage distribution. Each read operation includes setting a read voltage, detecting the conductivity state of the storage elements and transferring the data for further processing, e.g., at an external host controller. As a result, the time and processing resources needed to determine the threshold level distribution can be burdensome. There is a need for a technique for quickly measuring the threshold voltage distribution of a memory device that overcomes the above-mentioned disadvantages.

FIG. 7 depicts a process for measuring a characteristic of a set of storage elements. In this approach, a characteristic is determined which relates to the behavior of multiple storage elements, e.g., in a page. By determining the behavior of a set of storage elements as a whole, rather than determining the behavior of each storage element individually, many economies can be achieved, including reduced processing time and consumption of processing resources.

In one possible approach, the control gate voltage of a set of storage elements is varied over a range of voltages, e.g., in a voltage sweep. This can be achieved by varying the voltage applied to a selected word line, for instance, starting from an initial level and proceeding to a final level. The voltage can start low and increase, or start high and decrease. Step 700 includes setting a control gate voltage of the storage elements at an initial level, e.g., $_{REF-INITIAL}$. Step 705 includes setting pass voltages for the unselected storage elements, e.g., via their respective word lines. Note that the steps shown in this and other flowcharts need not necessarily be performed as discrete steps in the sequence shown. Step 710 includes incrementing the control gate voltage while measuring a characteristic of the set of storage elements. Typically, the control gate voltage can be controlled according to a minimum voltage resolution, which represents the smallest change in voltage which can be provided. For example, the control gate voltage can be provided by a digital-to-analog converter which outputs a series of voltages in response to a series of code words. Such a digital-to-analog converter can be provided within the power control module 1616 of FIG. 16a, for instance. The characteristic of the set of storage elements which is measured can include any physical characteristic that is indicative of the number of storage elements in the set that satisfy a given condition. For example, the characteristic can include current, voltage, capacitance, and the given condition can be the number of storage elements which are in a conductive or non-conductive state. The given condition can also be whether the threshold voltage of a storage element is below a given value, between two given values, or above a given value.

In one approach, the characteristic is measured at a common point, such as a source line, which is in communication with the storage elements. A small amount of additional hardware and/or software may be needed to perform this function. For example, a measurement device 1454 in FIG. 14 may measure the characteristic and provide corresponding data to a controller of the memory device. Generally, any parameter that changes when a voltage sweep is applied to the control gate can be measured. Making a combined or aggregate measurement of a parameter of multiple storage elements provides the needed data for estimating the threshold voltage distribution of the set of storage elements.

Referring to FIG. 7, optional step 715 includes locking out storage elements which become conductive while incrementing the control gate voltage. The cumulative current of conducting storage elements may be large compared to the changes in the current magnitude when the control gate is varied on the word line, thus limiting the accuracy of the threshold voltage evaluation based on the cumulative current measurement. To address this, in one possible approach, the bit line is grounded for the storage elements which become conductive at the time it is determined that they have become conductive. Each bit line can be pre-charged for reading, as discussed previously, when the control gate voltage is applied, so that the bit line discharges when the control gate voltage is raised above the threshold voltage of the storage element due to the storage element transitioning from a non-conductive state to a conductive state.

This discharging is sensed by a sense amplifier that is connected to each bit line, in one possible implementation, and reported back to a control circuit. The control circuit then removes a voltage which is applied to the bit lines of the corresponding storage elements, causing the storage element to transition from the conductive state to the non-conductive state. For example, as the control gate voltage is increased above $V_{R1}$ (see FIG. 6b), the storage elements which are in the erased state transition to the conductive state, while the storage elements which are in states 1-7 remain in the non-conductive state. Similarly, as the control gate voltage is increased above $V_{R2}$ (see FIG. 6b), the storage elements which are in state 1, and a few of the storage elements which are in state 2, transition to the conductive state.

Step 720 includes storing the results of the above steps, including the characteristic versus control gate voltage data, for analysis, e.g., by an external host controller which is in communication with the memory device, by the memory device itself or by some other entity.

FIG. 8 depicts a process for using the characteristic obtained by the process of FIG. 7 in setting read reference voltages. Step 800 includes accessing the characteristic vs. control gate voltage data which has been obtained. Step 805 includes determining control gate voltages for which the characteristic is approximately constant, indicating no new storage elements are conducting. See, e.g., FIG. 11a, discussed further below. Step 810 includes setting new read reference voltages $V_{R1A}$ through $V_{R7A}$ based on the control gate voltages for which the characteristic is approximately constant. See, e.g., FIG. 11b, discussed further below. Step 815 includes storing the new read reference voltages for use in one or more subsequent read operation.

The process depicted in FIGS. 7 and 8 can be performed from time to time as needed to address shifts and widening of the threshold voltage. For example, the process may be triggered when a number of detected read bit errors exceeds a threshold, when a temperature change exceeds a threshold, when a number of programming cycles exceeds a threshold, when a specified amount of time that has passed since user data was written, and so forth. Generally, a balance should be struck between reducing read errors and avoiding excessive overhead costs. Conceivably, new read reference values could be determined before each read, if resources and time permit. In one approach, the process for determining new read reference values can be performed while the memory device is not busy with other tasks.

FIG. 9a depicts a control gate voltage which increases continuously. Here, the control gate voltage, $V_{CG}$, depicted by line 900, is incremented from an initial reference value $V_{REF-INITIAL}$ to a final reference value, $V_{REF-FINAL}$, in a continuous sweep. For example, the control gate voltage can be incremented according to a minimum voltage resolution, which represents the smallest change in voltage which the memory device is capable of providing. As mentioned, the control gate voltage can be swept in an increasing or decreasing direction. The span between the initial value and the final value may encompass the lowest through the highest expected read reference voltages. The rate at which the control gate voltage varies can be set at an appropriate level based, e.g., on a response time of the storage elements, the rate at which the characteristic of the set of storage elements is measured, and other factors. Further, it is possible for the control gate voltage to vary at different rates. For instance, it may be desirable to determine the threshold voltage distribution for one or more specific states with greater accuracy, e.g., when storage elements in the specific states are subject to a greater threshold voltage widening and/or shift. In this case, the control gate voltage can be varied at a slower rate (e.g., V/sec.) in the vicinity of these states. On the other hand, the control gate voltage can be varied at a faster rate in the vicinity of specific states for which the threshold voltage distribution can be determined with less accuracy, e.g., for storage elements that are subject to a smaller threshold voltage widening and/or shift.

Moreover, the rate at which the characteristic of the set of storage elements is measured similarly need not be fixed, but can vary, e.g., to obtain more readings in the vicinity of specific threshold voltages of particular interest. It is also possible to perform multiple passes of control gate voltage sweeps, such as to confirm or compare previous results. Further, it is possible to perform portions of the voltage sweeps at different times. For instance, a first voltage sweep may encompass the first four states, and a second voltage sweep at a later time may encompass the next four states. In another approach, the voltage sweep continues until another higher priority task is pending, at which time the voltage sweep is halted and the higher priority task is serviced. Once the higher priority task has been serviced, the voltage sweep can be resumed at the control gate voltage at which it left off or thereabout.

FIG. 9b depicts a control gate voltage which increases in discrete steps. Here, the control gate voltage, $V_{CG}$, depicted by line 950, is incremented from an initial value $V_{REF-INITIAL}$ to a final value, $V_{REF-FINAL}$, in discrete steps in a discrete voltage sweep, e.g., in a staircase manner. For example, each step can be greater than the minimum control gate voltage resolution. The timing and/or frequency of the measurement of the characteristic can be set so that at least one measurement is made for each $V_{CG}$ step.

FIG. 10 depicts a change in current in a storage element as a function of control gate voltage. The x-axis depicts control gate voltage, $V_{CG}$, and the y-axis depicts the current in an individual storage element, e.g., in mA. A curve 1000 depicts a change in current with $V_{CG}$. As the control gate voltage is swept from zero to some higher voltage, several points can be identified. In particular, the current is approximately zero until $V_{CG}$ reaches a value $V_1$, at which point the storage element begins to transition to a conductive state. The current increases rapidly at this stage, exemplified by the current $I_2$ which corresponds to the voltage $V_2$. After passing some higher voltage, $V_3$, the current become approximately constant at a maximum level. The storage element thus transitions from a non-conductive state to a conductive state as $V_{CG}$ is increased above the threshold voltage of the storage element.

FIG. 11a depicts a combined current in a set of storage elements as a function of a continuously increasing control gate voltage. The cumulative or combined current of a set of storage element can be measured by a measurement device which is coupled to each storage element in the set, in one approach. For example, the current which passes through each conductive storage element travels to the common source line. Thus, an appropriate ammeter can be coupled to the common source line to measure the combined current, in one possible approach. Moreover, other characteristics of the set of storage elements, such as voltage and capacitance, can be measured similarly using appropriate circuitry. For instance, voltage can be measured using a voltmeter and capacitance can be measured using a capacitance meter. The characteristic thus includes contributions from a number of the storage elements in aggregate without necessarily identifying the contributions of specific individual storage elements. The x-axis depicts control gate voltage, $V_{CG}$, and the y-axis depicts the combined current in a set of storage elements. A curve 1100 depicts a change in current with $V_{CG}$. VCG varies between $V_{REF\text{-}INITIAL}$ and $V_{REF\text{-}FINAL}$. The y-axis also represents the number of conductive storage elements, as there is a direct relationship between the combined current and the number of conductive storage elements.

As depicted by the curve 1100, the current starts at zero, in one implementation, while $V_{CG}$ is low and all storage elements are in a non-conductive state. The current then increases and levels off, as discussed in connection with FIG. 10, when the storage elements in the lowest state transition to a conductive state. This cycle is repeated for each state. Essentially, the combined current becomes approximately constant for $V_{CG}$ values at which no new storage elements are transitioning to the conductive state, and the combined current increases rapidly when more storage elements contribute to the cumulative current as they start to conduct. Thus, by measuring the cumulative current, it is possible to evaluate the threshold voltage distribution of the set of storage elements, as depicted in FIG. 11b, and this can be used for determining the optimal setting of new read reference voltages, $V_{R1A}$ through $V_{R7A}$.

Note that the spacing between neighboring voltages of the read reference voltages $V_{R1A}$ through $V_{R7A}$, is greater than the spacing between neighboring voltages of the control gate voltages, e.g., in FIGS. 9a and 9b.

FIG. 11b depicts a threshold voltage distribution which is based on FIG. 11a. The x-axis depicts threshold voltage, which corresponds to $V_{CG}$ in FIG. 11a, and the y-axis depicts the number of storage elements. Here, the widened and/or shifted threshold voltage distribution of FIG. 6b is repeated. However, new read reference voltages, $V_{R1A}$ through $V_{R7A}$, which are optimal for the current threshold voltage distribution, are provided. Each read reference voltage can be provided at a voltage at which the combined current is relatively constant. For example, $V_{R1A}$ is provided between states 0 and 1 at a location in the curve 1100 which is flat. In one approach, the read reference voltage is provided at a midpoint of the flat region of the combined current to provide an equal margin between the top of state 0 and the bottom of state 1. Similarly, $V_{R2A}$ is provided between states 1 and 2 at a corresponding location in the curve 1100 which is flat. The other new read reference voltages can be determined similarly.

As mentioned in connection with FIGS. 6 and 7, data which represents the curve 1100 can be obtained and processed to determine the new read reference voltages, e.g., by a host controller or other entity. The rate at which measurements are taken should be set to obtain a desired resolution in the combined current or other characteristic. Typically, multiple measurements, e.g., using corresponding read reference voltages, are taken for each state to detect the lower and upper boundaries of the threshold voltage distribution of each state. The multiple measurements also allow distinguishing the upper boundary of one state from the lower boundary of the next higher state. That is, the read reference voltages can be set to distinguish adjacent states of the storage elements. For example, read reference voltages can be set to distinguish between the two adjacent states 0 and 1, between the two adjacent states 1 and 2, and so forth.

Further, the information represented by the curve 1100 can be obtained using a continuous or discrete $V_{CG}$ sweep. In practice, in either case, the curve 1100 is formed from a number of measurement points at different $V_{CG}$ values.

FIG. 12a depicts a combined current in a set of storage elements as a function of a step wise increasing control gate voltage. The x-axis depicts control gate voltage, $V_{CG}$, and the y-axis depicts the combined current in a set of storage elements. A curve 1200 depicts a change in current with $V_{CG}$. The control gate voltage sweep can be provided as a series of discrete values as shown in FIG. 9b. To show additional detail, an enlarged portion of the control gate voltage sweep for states 3 and 4 is provided. Each dot represents a measurement of combined current. As discussed, a repeating cycle is seen in which the combined current increases as additional storage elements transition to the conductive state and then plateaus at areas of constant current.

FIG. 12b depicts a threshold voltage distribution which is based on FIG. 12a. The x-axis depicts threshold voltage, which corresponds to $V_{CG}$ in FIG. 12a, and the y-axis depicts the number of storage elements. Dots 1250 represent the threshold voltage distribution of state 3 and dots 1255 represent the threshold voltage distribution of state 4. Here, the new read reference voltages $V_{R3A}$, $V_{R4A}$ and $V_{R5A}$ are depicted at the midpoints of the constant current regions of FIG. 12a. In particular, $V_{R3A}$ is the read reference voltage between states 2 and 3, $V_{R4A}$ is the read reference voltage between states 3 and 4, and $V_{R5A}$ is the read reference voltage between states 4 and 5. In this example, ten measurement points are used for each state, similar to performing read operations with ten reference voltages per level, but contrary to the case of multiple read operations, only the combined current need be measured and the processing resources for reading each storage element separately are not needed.

FIG. 13a depicts a combined current in a set of storage elements as a function of a step wise increasing control gate voltage, with lockout of conducting storage elements. The x-axis depicts control gate voltage, $V_{CG}$, and the y-axis depicts the combined current in a set of storage elements. A curve 1300 depicts a change in current with $V_{CG}$. As mentioned in connection with step 715 of FIG. 7, the combined current of multiple conducting storage elements may be large compared to the changes in current magnitude when a voltage sweep is applied to the word line, thus limiting the accuracy of the threshold voltage evaluation. A technique of shutting off the bit lines that become conductive, due to the associated selected storage element becoming conductive, can be used to improve the accuracy of the threshold voltage evaluation. In this example, ten discrete reference voltages are applied to the selected word line for each state and the combined current is measured for each reference voltage, as indicated by each dot. The bit lines that become conductive at one reference voltage measurement point are shut off after the measurement, so they do not contribute any current in the next combined current measurement. The actual current measurement becomes similar in shape to the threshold voltage distribution.

As in FIG. 12a, the control gate voltage sweep can be provided as a series of discrete values as shown in FIG. 9b. To show additional detail, an enlarged portion of the control gate voltage sweep for states 3 and 4 is provided. The set of dots 1300 represents combined current measurements for state 3 and the set of dots 1305 represents combined current measurements for state 4. Each dot represents a combined current from the storage elements which became conductive at the corresponding time and $V_{GC}$.

FIG. 13b depicts a threshold voltage distribution which is based on FIG. 13a. The x-axis depicts threshold voltage, which corresponds to $V_{CG}$ in FIG. 13a, and the y-axis depicts the number of storage elements. Dots 1350 represent the threshold voltage distribution of state 3 and dots 1355 represent the threshold voltage distribution of state 4. The new read reference voltages $V_{R3A}$, $V_{R4A}$ and $V_{R5A}$ are depicted at the midpoints of the constant current regions of FIG. 13a. In this example, the read reference voltages are set to respective $V_{CG}$ values. It is also possible to interpolate between respective $V_{CG}$ values in setting new read reference voltages.

Figure 14:
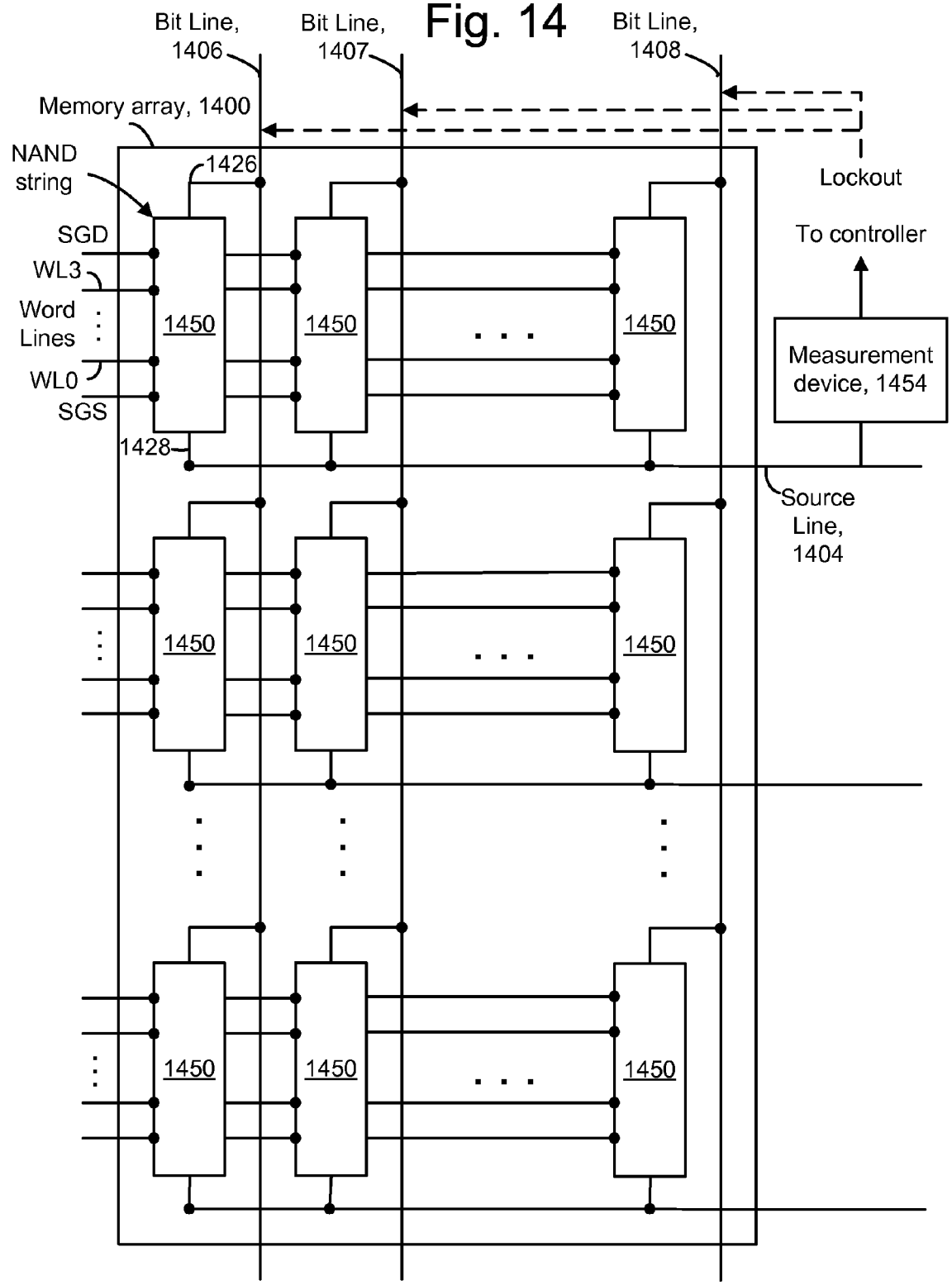
FIG. 14 is a block diagram of an array of NAND flash storage elements.

FIG. 14 is a block diagram of an array of NAND flash storage elements, such as those shown in FIGS. 1 and 2. Along each column, a bit line 1406 is coupled to the drain terminal 1426 of the drain select gate for the NAND string 1450. Along each row of NAND strings, a source line 1404 may connect all the source terminals 1428 of the source select gates of the NAND strings. An example of a NAND architecture array and its operation as part of a memory system is found in U.S. Pat. Nos. 5,570,315, 5,774,397 and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Additionally, a measurement device 1454 is coupled to the storage elements in different NAND strings, such as via a common source line 1404, in an example implementation. The measurement device 1454 can measure a combined current, voltage, capacitance or any other characteristic which indicates whether a number of storage elements satisfy a given condition. The given condition can be, e.g., whether a threshold voltage of a storage element is above or below a certain value, or within a certain range of values. The measurement device 1454 may communicate its findings to a controller of the memory device. Note that the measurement device 1454 may be used for measuring a characteristic of other sets of NAND strings in the memory array 1400, or separate measurement devices may be provided for the other sets of NAND strings.

The controller may respond to the information received from the measurement device 1454 by locking out bit lines and associated storage elements, e.g., bit lines 1406, 1407 and/or 1408, in an optional embodiment, as indicated by the notation "Lockout" in FIG. 14. As mentioned, once a bit line or storage element becomes conductive, it may be locked out so that it does not contribute to subsequent measurements. For example, the bit line may be grounded so that the associated selected storage element is no longer conductive.

Figure 15:
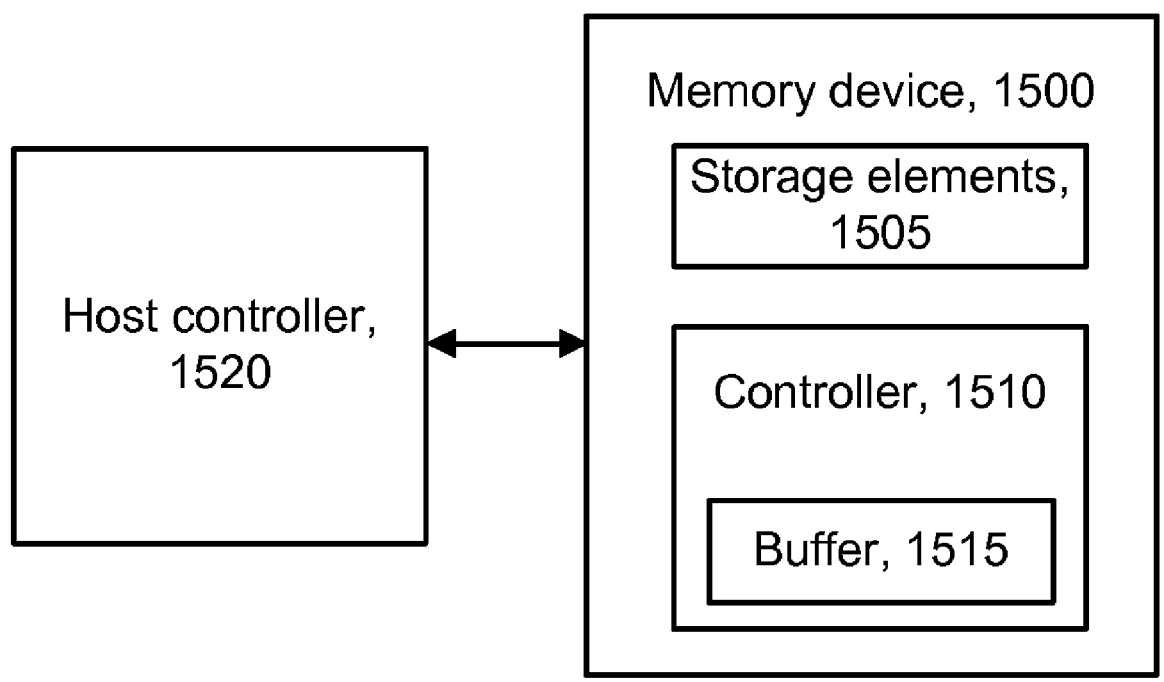
FIG. 15 depicts an overview of a host controller and a memory device.

FIG. 15 depicts an overview of a host controller and a memory device in a storage system. The memory device alone may also be considered to be a storage system. Storage elements 1505 can be provided in a memory device 1500 which has its own controller 1510 for performing actions such as reading data from the storage elements and writing data to the storage elements. The memory device may be formed on a removable memory card or USB flash drive, for instance, which is inserted into a host device such as a laptop computer, digital camera, personal digital assistant (PDA), digital audio player or mobile phone. The host device may have its own controller for interacting with the memory device, such as to read or write user data. For example, when reading data, the host controller can send commands to the memory device indicating an address of user data to be retrieved. The memory device controller converts such commands into command signals that can be interpreted and executed by control circuitry in the memory device. The controller 1510 may also contains buffer memory 1515 for temporarily storing the user data being written to or read from the memory array. The host controller may be considered to be an entity which is outside of, or external to, the memory device. The memory device may include one or more memory die, for instance, and the host controller may be outside the one or more memory die, discussed in connection with FIGS. 16a and 16b.

The memory device responds to a read command by reading the data from the storage elements and making it available to the host controller. In one possible approach, the memory device stores the read data in the buffer 1515 and informs the host controller of when the data can be read. The host controller responds by reading the data from the buffer and sends another command to the memory device to read data from another address. For example the data may be read page by page. The host controller may process the read data to determine a threshold voltage distribution of the storage elements of the memory device. In another approach, control circuitry of the memory device determines the threshold voltage distribution. Further details of example embodiments of a memory device are provided below.

A typical memory system includes an integrated circuit chip that includes the controller 1510, and one or more integrated circuit chips that each contains a memory array and associated control, input/output and state machine circuits. The memory device may be embedded as part of the host system, or may be included in a memory card that is removably insertable into a mating socket of a host system. Such a card may include the entire memory device, or the controller and memory array, with associated peripheral circuits, may be provided in separate cards.

Figure 16A:
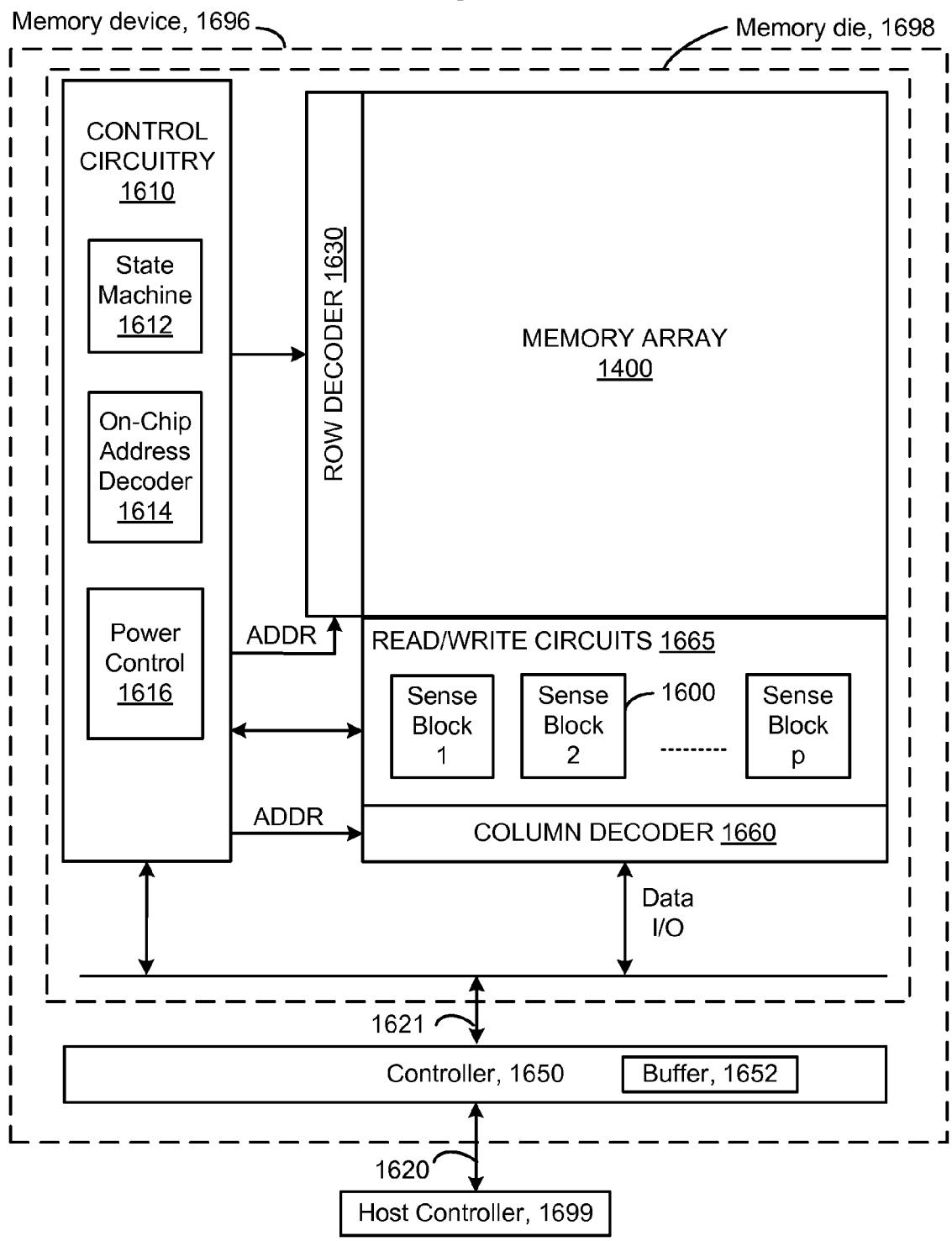
FIG. 16a is a block diagram of a non-volatile memory system using single row/column decoders and read/write circuits.

FIG. 16a is a block diagram of a non-volatile memory system using single row/column decoders and read/write circuits. The diagram illustrates a memory device 1696 having read/write circuits for reading and programming a page of storage elements in parallel, according to one embodiment of the present invention. Memory device 1696 may include one or more memory die 1698. Memory die 1698 includes a two-dimensional array of storage elements 1400, control circuitry 1610, and read/write circuits 1665. In some embodiments, the array of storage elements can be three dimensional. The memory array 1400 is addressable by word lines via a row decoder 1630 and by bit lines via a column decoder 1660. The read/write circuits 1665 include multiple sense blocks 1600 and allow a page of storage elements to be read or programmed in parallel. Typically a controller 1650 is included in the same memory device 1696 (e.g., a removable storage card) as the one or more memory die 1698. Commands and Data are transferred between the host and controller 1650 via lines 1620 and between the controller and the one or more memory die 1698 via lines 1621.

The control circuitry 1610 cooperates with the read/write circuits 1665 to perform memory operations on the memory array 500. The control circuitry 1610 includes a state machine 1612, an on-chip address decoder 1614 and a power control module 1616. The state machine 1612 provides chip-level control of memory operations. The on-chip address decoder 1614 provides an address interface between that used by the host or a memory controller to the hardware address used by the decoders 1630 and 1660. The power control module 1616 controls the power and voltages supplied to the word lines and bit lines during memory operations. For example, the power control module 1616 can provide a control gate read voltage to a selected word line, and read pass voltages to unselected word lines, for use during read operations and in determining a threshold voltage distribution of a set of storage elements. The power control module 1616 can also provide a voltage sweep to a selected word line. The power control module 1616 may include one or more digital-to-analog converters for this purpose, for instance. In this case, the control circuitry can generate a voltage sweep without the need for external test equipment, e.g., outside the memory die 1698. This is advantageous as it allows a voltage sweep to be generated at any time, including after manufacture of the memory device, when the end user has taken possession of the memory device. Further, the memory device 1696 can include circuitry for determining the threshold voltage distribution of the storage elements so that this process can be performed internally within the memory die 1698, without the need for external test equipment or an external host. This is advantageous as it allows the threshold voltage distribution to be determined at any time without external equipment.

In some implementations, some of the components of FIG. 16a can be combined. In various designs, one or more of the components (alone or in combination), other than storage element array 1400, can be thought of as a managing or control circuit. For example, one or more managing or control circuits may include any one of, or a combination of, control circuitry 1610, state machine 1612, decoders 1614/1660, power control 1616, sense blocks 1600, read/write circuits 1665, controller 1650, host controller 1699, etc.

The data stored in the memory array is read out by the column decoder 1660 and output to external I/O lines via the data I/O line and a data input/output buffer 1652. Program data to be stored in the memory array is input to the data input/output buffer 1652 via the external I/O lines. Command data for controlling the memory device are input to the controller 1650. The command data informs the flash memory of what operation is requested. The input command is transferred to the control circuitry 1610. The state machine 1612 can output a status of the memory device such as READY/BUSY or PASS/FAIL. When the memory device is busy, it cannot receive new read or write commands.

Figure 16B:
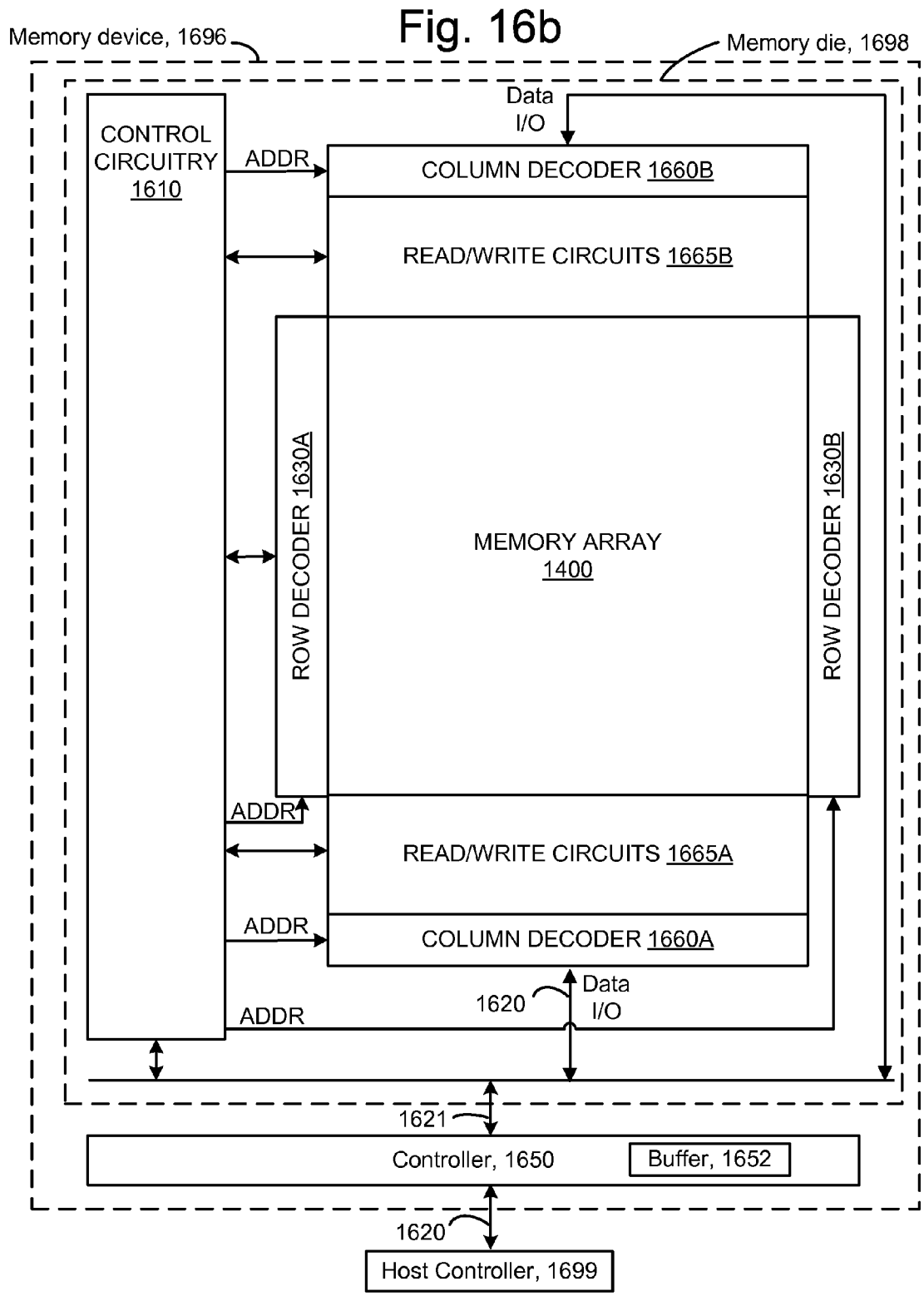
FIG. 16b is a block diagram of a non-volatile memory system using dual row/column decoders and read/write circuits.

FIG. 16b is a block diagram of a non-volatile memory system using dual row/column decoders and read/write circuits. Here, an alternative arrangement of the memory device 1696 shown in FIG. 16a is provided. Access to the memory array 1400 by the various peripheral circuits is implemented in a symmetric fashion, on opposite sides of the array, so that the densities of access lines and circuitry on each side are reduced by half. Thus, the row decoder is split into row decoders 1630A and 1630B and the column decoder into column decoders 1660A and 1660B. Similarly, the read/write circuits are split into read/write circuits 1665A connecting to bit lines from the bottom and read/write circuits 1665B connecting to bit lines from the top of the array 1400. In this way, the density of the read/write modules is essentially reduced by one half. The device of FIG. 16b can also include a controller 1650 with buffer 1652, as described above for the device of FIG. 16a.

Figure 17:
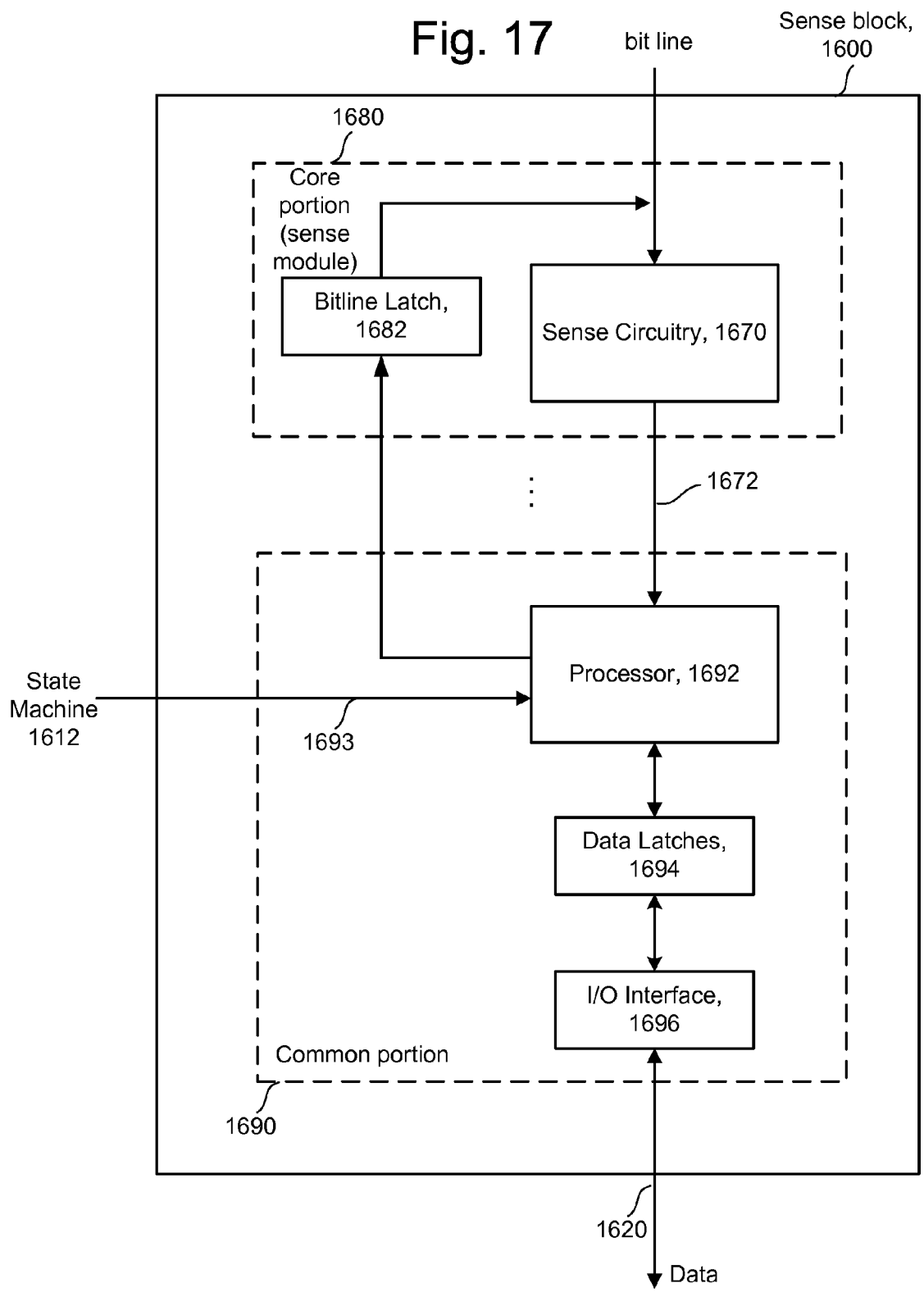
FIG. 17 is a block diagram depicting one embodiment of a sense block.

FIG. 17 is a block diagram depicting one embodiment of a sense block. An individual sense block 1600, depicted in FIG. 16a, is partitioned into a core portion, referred to as a sense module 1680, and a common portion 1690. In one embodiment, there will be a separate sense module 1680 for each bit line and one common portion 1690 for a set of multiple sense modules 1680. In one example, a sense block will include one common portion 1690 and eight sense modules 1680. Each of the sense modules in a group will communicate with the associated common portion via a data bus 1672. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1680 comprises sense circuitry 1670 that determines whether a conduction current in a connected bit line is above or below a predetermined threshold level. Sense module 1680 also includes a bit line latch 1682 that is used to set a voltage condition on the connected bit line. For example, a predetermined state latched in bit line latch 1682 will result in the connected bit line being pulled to a state designating program inhibit (e.g., $V_{DD}$).

Common portion 1690 comprises a processor 1692, a set of data latches 1694 and an I/O Interface 1696 coupled between the set of data latches 1694 and data bus 1620. Processor 1692 performs computations. For example, one of its functions is to determine the data stored in the sensed storage element and store the determined data in the set of data latches. The set of data latches 1694 is used to store data bits determined by processor 1692 during a read operation. It is also used to store data bits imported from the data bus 1620 during a program operation. The imported data bits represent write data meant to be programmed into the memory. I/O interface 1696 provides an interface between data latches 1694 and the data bus 1620.

During read or sensing, the operation of the system is under the control of state machine 1612 that controls the supply of different control gate voltages to the addressed storage element. As it steps through the various predefined control gate voltages corresponding to the various memory states supported by the memory, the sense module 1680 may trip at one of these voltages and an output will be provided from sense module 1680 to processor 1692 via bus 1672. At that point, processor 1692 determines the resultant memory state by consideration of the tripping event(s) of the sense module and the information about the applied control gate voltage from the state machine via input lines 1693. It then computes a binary encoding for the memory state and stores the resultant data bits into data latches 1694. In another embodiment of the core portion, bit line latch 1682 serves double duty, both as a latch for latching the output of the sense module 1680 and also as a bit line latch as described above.

It is anticipated that some implementations will include multiple processors 1692. In one embodiment, each processor 1692 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1694 from the data bus 1620. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1692 monitors the read back memory state relative to the desired memory state. When the two are in agreement, the processor 1692 sets the bit line latch 1682 so as to cause the bit line to be pulled to a state designating program inhibit. This inhibits the storage element coupled to the bit line from further programming even if programming pulses appear on its control gate. In other embodiments the processor initially loads the bit line latch 1682 and the sense circuitry sets it to an inhibit value during the verify process.

Data latch stack 1694 contains a stack of data latches corresponding to the sense module. In one embodiment, there are three data latches per sense module 1680. In some implementations (but not required), the data latches are implemented as a shift register so that the parallel data stored therein is converted to serial data for data bus 1620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, issued Mar. 27, 2007, titled "Non-Volatile Memory And Method With Reduced Source Line Bias Errors"; (2) U.S. Pat. No. 7,023,736, issued Apr. 4, 2006, titled "Non-Volatile Memory And Method with Improved Sensing"; (3) U.S. Pat. No. 7,046,568, issued May 16, 2006, titled "Memory Sensing Circuit And Method For Low Voltage Operation"; (4) U.S. Patent Application Pub. 2006/0221692, published Oct. 5, 2006, titled "Compensating for Coupling During Read Operations of Non-Volatile Memory"; and (5) U.S. Patent Application Pub. No. 2006/0158947, published Jul. 20, 2006, titled "Reference Sense Amplifier For Non-Volatile Memory." All five of the immediately above-listed patent documents are incorporated herein by reference in their entirety.

In standard NAND devices, the reading reference voltages are preset by the manufacturer and are not changeable by the users. In some devices, it is possible for the user to change read voltages by issuing a command, but this is typically limited in flexibility and quite cumbersome when used for generating a full histogram, that requires many readings, each requiring its separate re-setting of reference. The solution described so far in the text is proposed in order to solve this by providing an efficient method in which most of the work in controlling the generation of the readings required for the histogram is done by the memory die with relatively little intervention of the flash controller (actually it is even better—there is no real reading of the individual cells, only counting of their number in each interval of threshold voltage).

This is a very good solution, although a new circuitry module inside the flash die may be needed for summing of currents or voltages of many cells. However, there is also room for other solutions that require less from the memory die, putting more burden on the flash controller, while still providing a less cumbersome approach than prior approaches. For example, one solution is based on adding dedicated new commands to the memory—commands that allow the sequence of readings required for the histogram to be handled in an efficient manner without having to explicitly set the next reading level for each reading step.

Figure 18:
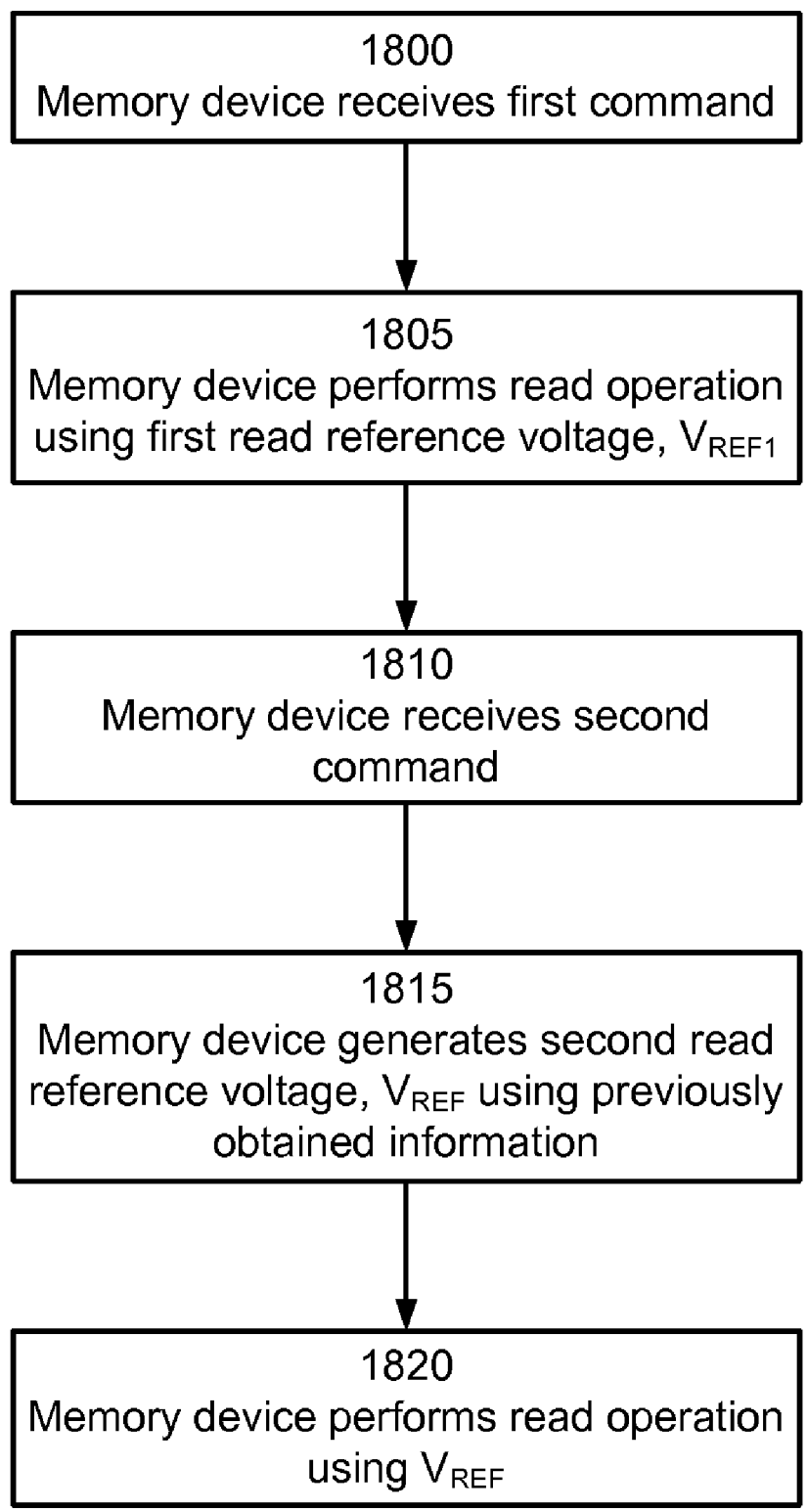
FIG. 18 depicts a process for performing read operations.

FIG. 18 depicts a process for performing read operations. Typically, read operations involve a controller sending commands to the memory device to read data at a specific address, such as a page address, as mentioned. However, in some situations, it is desirable for the memory to device to perform read operations at least partially autonomously. A technique is provided herein in which a memory device generates one or more read reference voltages rather than being explicitly supplied with each read reference voltage from a controller. The technique generally involves providing a command to a memory device that causes a reading of a set of storage elements by the memory device using a reference voltage which is different than a reference voltage used in a previous reading, where the new read reference value is not explicitly set outside the memory device. The technique can be used, in one example implementation, in determining a threshold voltage distribution of a set of storage elements.

In an example process, step 1800 includes the memory device receiving a first command. For instance, this can be a read command which specifies an address of a page of storage elements to be read. The command can include a first read reference voltage, or the memory device can be pre-configured with a first read reference voltage. Step 1805 includes the memory device performing a read operation using the first read reference voltage, $V_{REF1}$, in response to the first command. The data which is read may be stored in a buffer, for instance, as discussed, and the memory device may inform the controller that the data can be retrieved from the buffer. At step 1810, the memory device receives a second command. For instance, this can be a read command which specifies an address of another page of storage elements to be read. At step 1815, the memory device generates a second read reference voltage, $V_{REF2}$, using previously obtained information, e.g., information obtained prior to receiving the first command.

For instance, the memory device may be pre-configured with a voltage step size, $V_{STEP}$, which it uses to generate $V_{REF2}$ from $V_{REF2}=V_{REF1}+V_{STEP}$ or $V_{REF2}=V_{REF1}+n \cdot V_{STEP}$, where n is a multiplier, or from a general relationship of $V_{REF2}=f(V_{REF1})$, where "f" represents some function. Thus, in one approach, the memory device does not receive $V_{REF2}$ with the second command, or any other command, but instead uses previously obtained information for determining different read reference voltage based on the first read reference voltage. The information which is pre-configured into the memory device may be built in, so that it need not be provided by an external controller. At step 1820, the memory device performs a read operation using $V_{REF2}$, in response to the second command. The process may continue similarly for additional read operations at different read reference voltages. In another possible approach, the step size can be set by the controller—either as part of the first read command or in a separate command.

In a particular implementation, the memory device reads the storage elements in response to the first command using only $V_{REF1}$ and no other read reference voltage, and the memory device reads the storage elements in response to the second command using only $V_{REF2}$ and no other read reference voltage.

Figure 19:
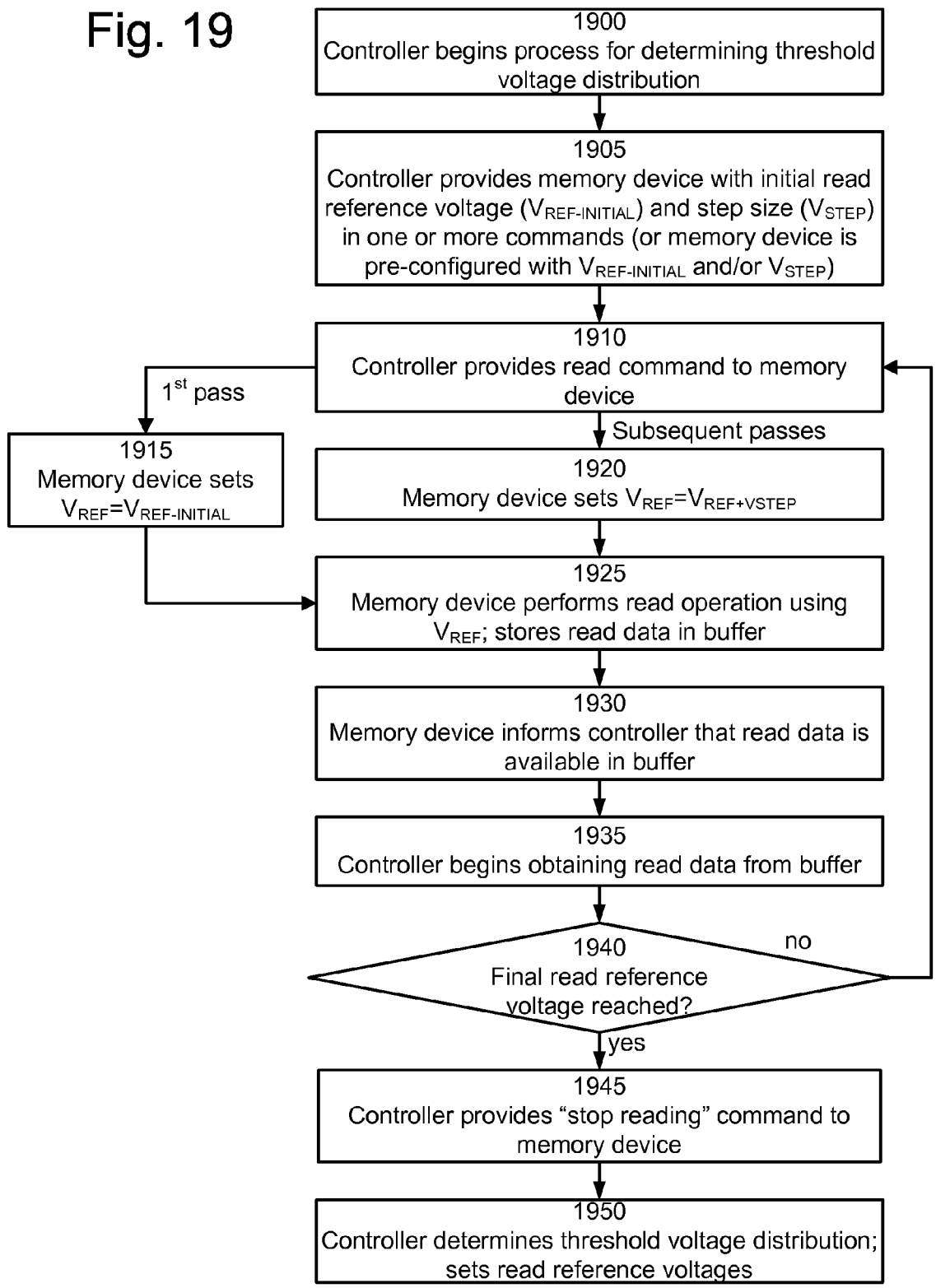
FIG. 19 depicts a process for determining a threshold voltage distribution.

FIG. 19 depicts a process for determining a threshold voltage distribution. Generally, the measurement of threshold voltage distribution, also referred to as cell voltage distribution (CVD), in flash memory devices is an important tool in both real-time management of the flash operation as well as in the testing, validation, verification and qualification of state-of-the-art flash devices. An efficient technique for computing a threshold voltage distribution is therefore useful. Threshold voltage distribution has been used mainly for evaluation of devices, where its computation involves either use of external analog equipment or complicated flash device internal test sequences. However, such approaches lack flexibility and efficiency for being implemented "on-line" in either real time flash management procedures or in manufacturing testing, where the time element is critical. The techniques provided herein efficiently measure threshold voltage distribution and address these issues.

In an example implementation, a memory device is configured with an initial read reference voltage, $V_{REF}$, and a voltage step size, $V_{STEP}$, and subsequently generates new read reference voltages, e.g., from the relationship $V_{REF}=V_{REF}+V_{STEP}$. $V_{STEP}$ thus provides the resolution with which the threshold voltage distribution is determined. Note that the step size for determining the threshold voltage distribution is not necessarily the same as that used in a programming sequence. At step 1900, a controller, such as an external host controller, begins a process for determining a threshold voltage distribution. The process can be initiated based on, e.g., a number of program-erase cycles, temperature changes, an elapsed time that user data has been stored in the memory device, a number of bit errors or other error metric from read operations, whether no other higher priority tasks are pending, and so forth. At step 1905, the controller provides the memory device with an initial read reference voltage $V_{REF-INITIAL}$ and a step size $V_{STEP}$ in one or more commands. Or, the memory device can be pre-configured with $V_{REF-INITIAL}$ and/or $V_{STEP}$, e.g., before receiving the one or more commands. The information which is pre-configured into the memory device may be built in, so that it need not be provided by an external controller.

In any case, the $V_{REF-INITIAL}$ and/or $V_{STEP}$ provide sufficient information for the memory device to generate a number of successive read reference values for reading a set of storage elements. Note that $V_{STEP}$ can be positive or negative, in which case the memory device can generate an ascending or descending staircase of voltages, respectively, to be applied to a selected word line. It is also possible for the memory device to receive, or be pre-configured with, information for other voltage sequences. For instance, such information can define multiple step sizes and so forth. To illustrate, it may be desired to determine a threshold voltage distribution with a first and second step sizes for first and second groups of states, respectively. The information provided can therefore define how many read operations are performed with the first step size before switching to the second step size, for instance.

At step 1910, the controller provides a read command to the memory device. The read command may include a page address, for instance, of a page of storage elements to be read. The read command can include the $V_{REF-INITIAL}$ and/or $V_{STEP}$ values or be provided as a separate command. In a first pass of the process of FIG. 19, at step 1915, the memory device sets the current read reference value $V_{REF}$ to $V_{REF-INITIAL}$. At step 1925, the memory device performs a read operation by applying $V_{REF}$ to the selected word line. The data which is read is stored in a buffer of the memory device, as discussed. In one approach, the data which is read represents a characteristic of the set of storage elements as a whole, as discussed previously, for example only the number of conducting cells is provided. It is also possible for the data which is read to provide information regarding the behavior of individual storage elements, such as whether individual storage elements are in a conductive or non-conductive state.

At step 1930, the memory device informs the controller that the read data is available in the buffer, e.g., by setting a READY signal. At step 1935, the controller begins obtaining, e.g. reading out, the read data from the buffer. At decision step 1940, if the final read reference voltage has not yet been reached, and the process loops back to step 1910, where the controller provides a next read command (e.g., a "continue" command) to the memory device. In this subsequent pass, step 1920 is executed, in which the memory device increments the current value of $V_{REF}$ by $V_{STEP}$. Steps 1925 through 1935 are then repeated. At decision step 1940, when the final read reference voltage is reached, the controller provides a "stop reading" command to the memory device (step 1945). At step 1950, the controller determines the threshold voltage distribution and sets new read reference voltages accordingly, such as discussed above in connection with FIGS. 7-14. As discussed, the new read reference voltages can account for widening and shifting of threshold voltages of the storage elements to allow more accurate read operations.

Note that other possible approaches do not require the "stop" command, mentioned in step 1945. For example, the controller can simply abort the sequence of readings by sending another (regular) command such as read or write. It is not impossible to do it with an explicit stop command (the "read with cache" sequence works like that), but it is not really needed. Thus, the use of a "stop" command is just an example, but the command is not required for implementing the invention.

In a specific implementation, a technique for efficiently measuring threshold voltage distribution includes an operation sequence and associated set of commands, implemented in the memory device, and a counting and computation procedure in the controller. The operation sequence enables consecutive reads of a designated flash page or other set of storage elements, while automatically incrementing the read threshold from one read operation to another, thus generating a type of "scan" over the read threshold voltage range. The parameters of this "scan", e.g., initial read threshold, $V_{REF-INITIAL}$, and the threshold step, $V_{STEP}$, are loaded to the memory device by the controller prior to the command execution.

Upon completion of current read operation (a step in a "scan") the memory device signals to the controller that new read data is available for processing. The controller may either issue a "continue" command for the next read step or "end of operation" (e.g., "stop reading") command to signal that this step is the last one. As a further time saving measure, the controller may read the data of the previous step while the memory device is executing the current step, similar to a "read with cache" operation.

Generally, the threshold voltage distribution of a group of storage element (usually a page or a block of storage elements) is a histogram of the threshold voltages of the storage elements. See, e.g., FIGS. 6a and 6b. As such, to obtain the threshold voltage distribution, one obtains, for every "bin" of voltage, the number of storage elements that have a threshold voltage within the "bin". This may be done by sensing the storage elements at a number of different read reference voltages which is equal to the number of voltage bins in the histogram. The sensing generally involves determining a response of the storage elements to the application of the read reference voltage, such as determining whether the storage elements become conductive or determining a characteristic of the storage elements. Thus, if the number of bins is N, the threshold voltage distribution starting voltage is $V_{REF-INITIAL}$ and the bin size is $V_{STEP}$, then the sensing operations can be performed with the following read reference voltages: $V_{REF-INITIAL}$, $V_{REF-INITIAL}+V_{STEP}$, $V_{REF-INITIAL}+2 \cdot V_{STEP}$, ..., $V_{REF-INITIAL}+(N-1) \cdot V_{STEP}$. The results in N binary read operations with a variable read threshold.

If the memory device supports setting read thresholds for read operations, then it is possible to perform the above mentioned procedure by issuing N read commands preceded by a command (or a set of commands) for setting a value of the read threshold.

In summary, an efficient approach to performing the necessary read operations for determining threshold voltage distribution is to implement in a memory device, a mechanism and commands, which enable substantially autonomous generation of the read thresholds for the sense operations. In one approach, as discussed, the controller provides the memory device with the initial read reference voltage, $V_{REF-INITIAL}$, and with the sense voltage step, $V_{STEP}$ or $\Delta V$, issues a "read threshold voltage distribution" command and monitors a ready/busy signal for an indication that the sense data is available at the memory device's buffer. When the signal is in the ready state, this indicates the sense data is available to be read out from the buffer by the controller. When the signal is in the busy state, this indicates the sense data is not available to be read out from the buffer. Once the read data is obtained, the next measurement point can be read.

An example command sequence for determining threshold voltage distribution is as follows. The specific commands used will depend on the implementation. A command for setting threshold voltage distribution scan parameters in which $V_{REF-INITIAL}$ and $V_{STEP}$ are provided in the same command is:

CMND1-Addr-Dat-1-Dat-2.

"CMND1" is a command for modifying internal parameters of the memory device. "Addr" is an address for storing the Dat-1 and Dat-2 in the memory device. "Dat-1" provides $V_{REF-INITIAL}$ and "Dat-2" provides $V_{STEP}$. Dat-1 can be a byte which can have a value ranging from 0-255, for instance, and an appropriate resolution. Dat-2 can be a byte which can have values ranging from 0-255 also, for instance, and has a resolution which is the smallest resolution available in the memory device, in one possible approach. Another option involves providing separate commands for $V_{REF-INITIAL}$ and $V_{STEP}$, e.g., command 1: CMND1-Addr-1-Dat-1, and
command 2: CMND1-Addr-2-Dat-2.

Here, Addr-1 is an address for storing Dat-1 in the memory device and Addr-2 is an address for storing Dat-2 in the memory device.

A command reading sequence which may be used is as follows:
CMND2-Data_Addr-CMND3-B/R-Read Data-CMND4-B/R-Read Data-CMND4 ... -B/R-CMND5-B/R-Read Data.

CMND2 is a code word which signals that the command is a reading command. Data_Addr is an address of the set of storage elements, such as a page address. CMND3 indicates that the read is for a threshold voltage distribution. CMND2, Data_Addr and CMND3 are commands which are provided by the controller to the memory device. "B/R" (busy/ready) indicates a busy or ready condition which is set by the memory device and monitored by the controller. When a busy/ready condition goes to busy and then returns to the ready state, this indicates to the controller that the sense data is available to be read out from the memory device's buffer. Read Data" indicates reading of data from the memory device. CMND4 indicates a "continue threshold voltage distribution" command issued by the controller. The memory device performs the next reading in response to this command. CMND5 is a command provided from the controller to the memory device to stop the reading process after the current read operation. Again, the command syntax provided here is an example only and will vary based on the specific implementation.

With the above-mentioned approach, the controller first sets $V_{REF-INITIAL}$ and $V_{STEP}$. The controller then issues a threshold voltage distribution read command sequence, similar to a normal read, waits for the ready signal and shifts the data out of the buffer. Upon completion of the current read operation and transfer of the read data to the cache buffer, the memory device increments the read reference voltage by $V_{STEP}$ and starts the next read threshold voltage distribution operation. Following shifting out the result of a previous read, the controller issues either a "continue" command (CMND4) or a termination command (CMND5). When the memory device receives the CNMD5 command, it stops the reading process after the current read operation, similar to a normal read with cache. In this case, the controller will have the last page of data available for shifting out after the B/R condition which follows CMND5 command.

Note that this example approach does not use caching because the "continue" command (CMND4) is sent only after the controller reads the data out. In order to use the "cached" method, CMND4 must come before the "Read Data" operation (in each of the iterations). Another approach, described in connection with FIG. 20, performs a sequence of readings using a cache-like method. In other words, the transfer of result N from the memory die to the controller is carried out in parallel with the loading of result (N+1) by the memory. This is like how the "read with cache" works in a regular NAND device. While these approaches are both feasible, the cached technique can be faster.

Figure 20:
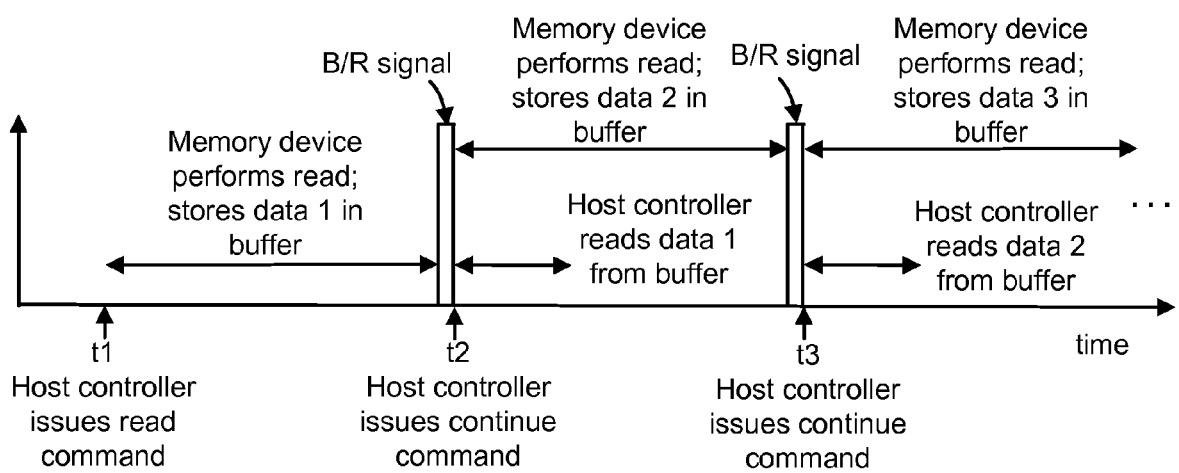
FIG. 20 depicts a time line showing a process for reading storage elements and transferring read data to a host controller.

FIG. 20 depicts a time line showing a process for reading storage elements and transferring read data to a host controller. At time t1, the host controller issues a read command to the memory device. In response, the memory device performs a read operation and stores data, e.g., data 1, in its buffer. The busy/ready (B/R) signal is set, in response to which the host controller issues a continue command at time t2 and begins to read out data 1 from the buffer. In response to the continue command, the memory device performs another read operation and stores data, e.g., data 2 in its buffer. Thus, the reading out of data from the buffer by the host controller can occur simultaneously, at least in part, with the reading of new data by the memory device. Similarly, the busy/ready (B/R) signal is set again, in response to which the host controller issues a continue command at time t3 and begins to read out data 2 from the buffer. In response to the continue command, the memory device performs another read operation and stores data, e.g., data 3 in its buffer. The process continues accordingly until the last data is read out.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
receiving, at the memory device, a first command which identifies a voltage step size;
in response to the first command, reading a set of storage elements in the memory device using a first read reference value;
subsequent to said reading, receiving, at the memory device, a second command; and
in response to the second command, reading the set of storage elements using a second read reference value, the memory device generates the second read reference value based on the voltage step size and the first read reference value, without receiving information for generating the second read reference value from outside the memory device subsequent to the receiving of the first command.

2. The method of claim 1, further comprising:
reading the set of storage elements a plurality of times, each time using a corresponding read reference value, the memory device generates the corresponding read reference values without receiving any information for generating the corresponding read reference values from outside the memory device subsequent to the receiving of the first command.

3. The method of claim 1, further comprising:
determining a threshold voltage distribution of the set of storage elements based, at least in part, on the reading using the first read reference value and the reading using the second read reference value.

4. The method of claim 1, wherein:
the memory device is pre-configured with a voltage step size, and the memory device generates the second read reference value based on the voltage step size and the first read reference value.

5. The method of claim 1, wherein:
the first command specifies the first read reference value.

6. The method of claim 1, wherein:
the first and second commands are received at the memory device from an external host controller.

7. The method of claim 6, wherein:
the memory device and the set of storage elements are on a memory die, and the external host controller is external to the memory die.

8. A method for operating a memory device, comprising:
receiving, at the memory device, a first command;
in response to the first command, reading a set of storage elements in the memory device using a first read reference value;
subsequent to said reading, receiving, at the memory device, a second command; and
in response to the second command, reading the set of storage elements using a second read reference value, the memory device is pre-configured with a voltage step size and generates the second read reference value based on the voltage step size and the first read reference value, without receiving information for generating the second read reference value from outside the memory device subsequent to the receiving of the first command; and
determining, based at least in part on the readings using the first and second read reference values, a threshold voltage distribution of the set of storage elements.

9. The method of claim 8, further comprising:
reading the set of storage elements a plurality of times, each time using a corresponding read reference value, the memory device generates the corresponding read reference values without receiving any information for generating the corresponding read reference values from outside the memory device subsequent to the receiving of the first command.

10. The method of claim 8, wherein:
the first command identifies a voltage step size, and the memory device generates the second read reference value based on the voltage step size and the first read reference value.

11. The method of claim 8, wherein:
the first command specifies the first read reference value.

12. The method of claim 8, wherein:
the first and second commands are received at the memory device from an external host controller.

13. The method of claim 12, wherein:
the memory device and the set of storage elements are on a memory die, and the external host controller is external to the memory die.

14. A method for operating a memory device, comprising:
providing, from a host controller to a memory device, at least a first command which identifies a voltage step size, the memory device reads a set of storage elements using a first read reference value in response to the at least a first command;
subsequent to the providing the at least a first command, providing from the host controller to the memory device, at least a second command, the memory device reads the set of storage elements using a second read reference value in response to the at least a second command, the memory device generates the second read reference value from the first read reference value and the voltage step size, without receiving information for generating the second read reference value from the host controller subsequent to the receiving of the at least a first command; and
determining, based at least in part on the readings using the first and second read reference values, a threshold voltage distribution of the set of storage elements.

15. The method of claim 14, wherein:
the at least a first command includes the first read reference value.

16. The method of claim 14, wherein:
the determining is performed, at least in part, by the host controller.

17. The method of claim 14, wherein:
upon completion of a current read operation, the host controller receives a signal from the memory device indicating that new data is available, the host controller obtains the new data and provides a continue command to the memory device in response to the signal, and the memory device begins a next read operation in response to the continue command.

18. The method of claim 17, wherein:
the host controller provides the continue command to the memory device before obtaining the new data, and the memory device begins the next read operation before the host controller completes obtaining the new data.

19. The method of claim 14, wherein:
the memory device and the set of storage elements are on a memory die, and the host controller is external to the memory die.

20. A storage system, comprising:
a set of storage elements in a memory device, the memory device is pre-configured with a voltage step size; and
at least one control circuit in the memory device, the at least one control circuit: a) receives a first command, b) in response to the first command, reads the set of storage elements using a first read reference value, c) subsequent to the reading, receives a second command, and d) in response to the second command, reads the set of storage elements using a second read reference value, the at least one control circuit generates the second read reference value based on the voltage step size and the first read reference value, without receiving information for generating the second read reference value from outside the memory device subsequent to the receiving of the first command.

21. The storage system of claim 20, wherein:
the at least one control circuit reads the set of storage elements a plurality of times, each time using a corresponding read reference value, and generates the corresponding read reference values without receiving any information for generating the corresponding read reference values from outside the memory device subsequent to the receiving of the first command.

22. The storage system of claim 20, wherein:
a threshold voltage distribution of the set of storage elements is determined based, at least in part, on the reading using the first read reference value and the reading using the second read reference value.

23. The storage system of claim 20, wherein:
the first command identifies a voltage step size, and the memory device generates the second read reference value based on the voltage step size and the first read reference value.

24. The storage system of claim 20, wherein:
the first command specifies the first read reference value.

25. The storage system of claim 20, wherein:
the first and second commands are received at the at least one control circuit from an external host controller.

26. The storage system of claim 25, wherein:
the memory device and the set of storage elements are on a memory die, and the external host controller is external to the memory die.

27. A storage system, comprising:
a set of storage elements in a memory device; and
at least one control circuit in the memory device, the at least one control circuit: a) receives a first command which identifies a voltage step size, b) in response to the first command, reads the set of storage elements using a first read reference value, c) subsequent to the reading, receives a second command, and d) in response to the second command, reads the set of storage elements using a second read reference value, the at least one control circuit generates the second read reference value based on the voltage step size and the first read reference value, without receiving information for generating the second read reference value from outside the memory device subsequent to the receiving of the first command, and a threshold voltage distribution of the set of storage elements is determined, based at least in part on the readings using the first and second read reference values.

28. The storage system of claim 27, wherein:
the at least one control circuit reads the set of storage elements a plurality of times, each time using a corresponding read reference value, and generates the corresponding read reference values without receiving any information for generating the corresponding read reference values from outside the memory device subsequent to the receiving of the first command.

29. The storage system of claim 27, wherein:
the memory device is pre-configured with a voltage step size, and the memory device generates the second read reference value based on the voltage step size and the first read reference value.

30. The storage system of claim 27, wherein:
the first command specifies the first read reference value.

31. The storage system of claim 27, wherein:
the first and second commands are received at the at least one control circuit from an external host controller.

32. The storage system of claim 31, wherein:
the memory device and the set of storage elements are on a memory die, and the external host controller is external to the memory die.

33. A storage system, comprising:
a host controller in communication with a memory device;
the host controller providing to the memory device at least a first command which identifies a voltage step size, the memory device reads an associated set of storage elements using a first read reference value in response to the at least a first command;
subsequent to the providing the at least a first command, the host controller provides to the memory device at least a second command, the memory device reads the set of storage elements using a second read reference value in response to the at least a second command, the memory device generates the second read reference value based on the voltage step size and the first read reference value, without receiving information for generating the second read reference value from the host controller subsequent to the receiving of the at least a first command; and
a threshold voltage distribution of the set of storage elements is determined, based at least in part on the readings using the first and second read reference values.

34. The storage system of claim 33, wherein:
the at least a first command includes the first read reference value.

35. The storage system of claim 33, wherein:
the threshold voltage distribution of the set of storage elements is determined, at least in part, by the host controller.

36. The storage system of claim 33, wherein:
upon completion of a current read operation, the host controller receives a signal from the memory device indicating that new data is available, the host controller obtains the new data and provides a continue command to the memory device in response to the signal, and the memory device begins a next read operation in response to the continue command.

37. The storage system of claim 36, wherein:
the host controller provides the continue command to the memory device before obtaining the new data, and the memory device begins the next read operation before the host controller completes obtaining the new data.

38. The storage system of claim 33, wherein:
the memory device and the set of storage elements are on a memory die, and the host controller is external to the memory die.

* * * * *